United States Patent
Miyake

(10) Patent No.: US 9,508,709 B2
(45) Date of Patent: Nov. 29, 2016

(54) SEMICONDUCTOR DEVICE, LIGHT-EMITTING DEVICE, AND ELECTRONIC DEVICE

(71) Applicant: SEMICONDUCTOR ENERGY LABORATORY CO., LTD., Atsugi-shi, Kanagawa-ken (JP)

(72) Inventor: Hiroyuki Miyake, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 14/640,235

(22) Filed: Mar. 6, 2015

(65) Prior Publication Data

US 2015/0179635 A1    Jun. 25, 2015

Related U.S. Application Data

(63) Continuation of application No. 13/612,073, filed on Sep. 12, 2012, now Pat. No. 8,975,709.

(30) Foreign Application Priority Data

Sep. 16, 2011  (JP) .................................. 2011-202690

(51) Int. Cl.
  *G09G 3/3233*   (2016.01)
  *H01L 27/06*    (2006.01)
  (Continued)

(52) U.S. Cl.
  CPC ......... *H01L 27/0629* (2013.01); *G09G 3/3233* (2013.01); *G09G 3/3275* (2013.01);
  (Continued)

(58) Field of Classification Search
  CPC ... H01L 27/06; H01L 27/1225; H01L 27/32; H01L 27/3241; H01L 27/3244; G09G 3/3233; G09G 3/3275; G09G 2300/0852; G09G 2300/0861; G09G 2320/054; G09G 3/3241; G09G 3/325; G09G 3/3266; G09G 2300/0408; G09G 2310/0267; G09G 2310/027
  See application file for complete search history.

(56) References Cited

U.S. PATENT DOCUMENTS

5,731,856 A    3/1998  Kim et al.
5,744,864 A    4/1998  Cillessen et al.
(Continued)

FOREIGN PATENT DOCUMENTS

EP    1612766 A    1/2006
EP    1737044 A    12/2006
(Continued)

OTHER PUBLICATIONS

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

(Continued)

*Primary Examiner* — Galina Yushina
(74) *Attorney, Agent, or Firm* — Fish & Richardson P.C.

(57) ABSTRACT

An object is to prevent an operation defect and to reduce an influence of fluctuation in threshold voltage of a field-effect transistor. A field-effect transistor, a switch, and a capacitor are provided. The field-effect transistor includes a first gate and a second gate which overlap with each other with a channel formation region therebetween, and the threshold voltage of the field-effect transistor varies depending on the potential of the second gate. The switch has a function of determining whether electrical connection between one of a source and a drain of the field-effect transistor and the second gate of the field-effect transistor is established. The capacitor has a function of holding a voltage between the second gate of the field-effect transistor and the other of the source and the drain of the field-effect transistor.

14 Claims, 12 Drawing Sheets

(51) Int. Cl.
  *H01L 27/32* (2006.01)
  *H01L 27/12* (2006.01)
  *G09G 3/32* (2016.01)

(52) U.S. Cl.
  CPC .......... *H01L 27/06* (2013.01); *H01L 27/1225* (2013.01); *G09G 2300/0852* (2013.01); *G09G 2300/0861* (2013.01); *G09G 2320/045* (2013.01); *H01L 27/3241* (2013.01)

(56) References Cited

U.S. PATENT DOCUMENTS

| | | |
|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,199,768 B2 | 4/2007 | Ono et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,414,600 B2 * | 8/2008 | Nathan ................ G09G 3/3233 257/E27.111 |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,714,810 B2 | 5/2010 | Kasai et al. |
| 7,732,819 B2 | 6/2010 | Akimoto et al. |
| 8,022,903 B2 | 9/2011 | Yamamoto et al. |
| 8,067,775 B2 | 11/2011 | Miyairi et al. |
| 8,106,400 B2 | 1/2012 | Miyairi et al. |
| 8,144,102 B2 | 3/2012 | Takatoku |
| 8,659,519 B2 | 2/2014 | Abe et al. |
| 8,907,869 B2 * | 12/2014 | Chun ................ G09G 3/3233 345/76 |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0028408 A1 * | 2/2006 | Kim ................ G09G 3/3233 345/76 |
| 2006/0035452 A1 | 2/2006 | Carcia et al. |
| 2006/0043377 A1 | 3/2006 | Hoffman et al. |
| 2006/0054893 A1 | 3/2006 | Nathan et al. |
| 2006/0066512 A1 * | 3/2006 | Afentakis ................ G09G 3/20 345/55 |
| 2006/0091793 A1 | 5/2006 | Baude et al. |
| 2006/0092106 A1 | 5/2006 | Chang et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0154422 A1 * | 7/2006 | Chun ................ H01L 21/268 438/274 |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0225061 A1 | 9/2008 | Kimura et al. |
| 2008/0231576 A1 | 9/2008 | Yamamoto et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0009441 A1 * | 1/2009 | Yamamoto ........... G09G 3/3233 345/80 |
| 2009/0068773 A1 | 3/2009 | Lai et al. |
| 2009/0073325 A1 | 3/2009 | Kuwabara et al. |
| 2009/0102751 A1 * | 4/2009 | Takatoku ............. G09G 3/3659 345/55 |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0231241 A1 | 9/2009 | Abe |
| 2009/0278122 A1 | 11/2009 | Hosono et al. |
| 2009/0280600 A1 | 11/2009 | Hosono et al. |
| 2010/0032679 A1 | 2/2010 | Kawae et al. |
| 2010/0065844 A1 | 3/2010 | Tokunaga |
| 2010/0092800 A1 | 4/2010 | Itagaki et al. |
| 2010/0096654 A1 | 4/2010 | Godo |
| 2010/0109002 A1 | 5/2010 | Itagaki et al. |
| 2010/0301326 A1 | 12/2010 | Miyairi et al. |
| 2011/0031496 A1 | 2/2011 | Yamazaki et al. |
| 2011/0031499 A1 | 2/2011 | Kimura et al. |
| 2011/0057187 A1 | 3/2011 | Sakakura et al. |
| 2011/0062434 A1 | 3/2011 | Eguchi et al. |
| 2011/0108837 A1 | 5/2011 | Yamazaki et al. |
| 2011/0133181 A1 | 6/2011 | Yamazaki |
| 2011/0175674 A1 | 7/2011 | Shimizu et al. |
| 2011/0210324 A1 | 9/2011 | Sakakura et al. |
| 2011/0210355 A1 | 9/2011 | Yamazaki et al. |
| 2012/0061677 A1 | 3/2012 | Miyake |
| 2013/0063413 A1 | 3/2013 | Miyake |

FOREIGN PATENT DOCUMENTS

| | | |
|---|---|---|
| EP | 2161706 A | 3/2010 |
| EP | 2226847 A | 9/2010 |
| JP | 60-198861 A | 10/1985 |
| JP | 63-210022 A | 8/1988 |
| JP | 63-210023 A | 8/1988 |

(56) References Cited

FOREIGN PATENT DOCUMENTS

| | | |
|---|---|---|
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2003-224437 A | 8/2003 |
| JP | 2004-103957 A | 4/2004 |
| JP | 2004-273614 A | 9/2004 |
| JP | 2004-273732 A | 9/2004 |
| JP | 2004-280059 A | 10/2004 |
| JP | 2006-018277 A | 1/2006 |
| JP | 2008-083085 A | 4/2008 |
| JP | 2008-083171 A | 4/2008 |
| JP | 2008-233399 A | 10/2008 |
| JP | 2009-014933 A | 1/2009 |
| JP | 2009-099778 A | 5/2009 |
| JP | 2009-157157 A | 7/2009 |
| JP | 2010-060816 A | 3/2010 |
| JP | 2011-112722 A | 6/2011 |
| JP | 2011-146574 A | 7/2011 |
| WO | WO-2004/114391 | 12/2004 |

OTHER PUBLICATIONS

Asaoka.Y et al., "29.1: Polarizer-Free Reflective LCD Combined With Ultra Low-Power Driving Technology", SID Digest'09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transistion:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase," Phys. Rev. A (Physical Review. A) May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn—Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn—Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTs", SID Digest '08 : SID International Digest of Technical Papers, May 20, 2008, vol. 39, pp. 621-624.

Hirao.T et al., "Novel Top-Gate Zinc Oxide Thin-Film Transistors (ZnO TFTs) for AMLCDS", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using Cg-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters) , 2005, vol. 87, pp. 122102-1-122102-3.

Jeong.J et al., "3.1: Distinguished Paper: 12.1-Inch WXGA AMOLED Display Driven by Indium—Gallium—Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Compsites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N. et al., "Spinel,YbFe2O4, and Yb2Fe3O7 Types of Structures for Compounds in the In2O3 and Sc2O2—A2O3—BO Systems [A; Fe, Ga, or Al; B: Mg, Mn, Fe, Ni, Cu,or Zn] at Temperatures over 1000° C.", Journal of Solid State Chemistry, 1985, vol. 60, pp. 382-384.

Kimizuka.N. et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits , 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED ", IDW '06 : Proceedings of the 13th International Display Workshops, Dec. 7, 2006, pp. 663-666.

(56) References Cited

OTHER PUBLICATIONS

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Lee.M et al., "15.4:Excellent Performance of Indium—Oxide-Based Thin-Film Transistors by DC Sputtering", SID Digest '09 : SID International Symposium Digest of Technical Papers, May 31, 2009, pp. 191-193.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "SUFTLA Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW '08 : Proceedings of the 6th International Display Workshops, Dec. 3, 2008, pp. 581-584.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Nakamura.M, "Synthesis of Homologous Compound with New Long-Period Structure", NIRIM Newsletter, Mar. 1, 1995, vol. 150, pp. 1-4.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B. (Physical Review. B), 2008, vol. 77, pp. 245202-1-245202-6.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 In. QVGA AMOLED Display Using In—Ga—Zn—Oxide TFTs With a Novel Passivation Layer", SID Digest '09 : SID International Symposium Digest of Technical Papers, May 31, 2009, pp. 284-287.

Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide InGaO3(ZnO)m (m<4):a Zn4s conductor", Philosophical Magazine, 2001, vol. 81, No. 5, pp. 501-515.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn—Oxide TFT", SID Digest '09 : SID International Symposium Digest of Technical Papers, May 31, 2009, pp. 184-187.

Osada.T et al., "Development of Driver-Integrated Panel Using Amorphous In—Ga—Zn—Oxide TFT", AM-FPD '09 Digest of Technical Papers, Jul. 1, 2009, pp. 33-36.

Park.J et al., "Amorphous Indium—Gallium—Zinc Oxide TFTs and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium—Gallium—Zinc Oxide Semiconductor Upon Exposure to Water", Appl. Phys. Lett. (Applied Physics Letters) , 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, pp. 262106-1-262106-3.

Park.S et al., "Challenge to Future Displays: Transparent AM-OLED Driven by PEALD Grown ZnO TFT", IMID '07 Digest, 2007, pp. 1249-1252.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters) , Jun. 17, 1996, vol. 68, No. 25, pp. 3650-3652.

Sakata.J et al., "Development of 4.0-In. AMOLED Display With Driver Circuit Using Amorphous In—Ga—Zn—Oxide TFTs", IDW '09 : Proceedings of the 16th International Display Workshops, 2009, pp. 689-692.

Son.K et al., "42.4L: Late-News Paper: 4 Inch QVGA AMOLED Driven by the Threshold Voltage Controlled by Amorphous GIZO (Ga2O3—In2O3—ZnO) TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Tsuda.K et al., "Ultra Low Power Consumption Technologies for Mobile TFT-LCDs ", IDW '02 : Proceedings of the 9th International Display Workshops, Dec. 4, 2002, pp. 295-298.

Ueno.K et al., "Field-Effect Transistor on SrTiO3 With Sputtered Al2O3 Gate Insulator", Appl. Phys. Lett. (Applied Physics Letters) , Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

\* cited by examiner

SEMICONDUCTOR DEVICE, LIGHT-EMITTING DEVICE, AND ELECTRONIC DEVICE

CROSS-REFERENCE TO RELATED APPLICATIONS

This application is a continuation of U.S. application Ser. No. 13/612,073, filed Sep. 12, 2012, now allowed, which claims the benefit of a foreign priority application filed in Japan as Serial No. 2011-202690 on Sep. 16, 2011, both of which are incorporated by reference.

BACKGROUND OF THE INVENTION

1. Field of the Invention

One embodiment of the present invention relates to a semiconductor device. Further, one embodiment of the present invention relates to a light-emitting device. Furthermore, one embodiment of the present invention relates to an electronic device.

2. Description of the Related Art

In recent years, development of semiconductor devices including field-effect transistors has been advanced.

As an example of the semiconductor devices, there is a semiconductor device performing a desired operation by controlling the amount of current flowing between a source and a drain of the field-effect transistor (for example, see Patent Document 1).

REFERENCE

Patent Document

[Patent Document 1] Japanese Published Patent Application No. 2008-083085

SUMMARY OF THE INVENTION

However, conventional semiconductor devices have a problem in that the amount of current flowing between a source and a drain is difficult to control due to fluctuation in threshold voltage of a field-effect transistor. When the amount of current flowing between the source and the drain cannot be controlled, for example, an operation defect occurs in the semiconductor device.

An object of one embodiment of the present invention is to prevent an operation defect and/or to reduce an influence of fluctuation in threshold voltage of a field-effect transistor.

In one embodiment of the present invention, a field-effect transistor including a first gate and a second gate which overlap with each other with a channel formation region therebetween is used. By controlling the potential of the second gate, the threshold voltage of the field-effect transistor is determined. With the above structure, the amount of current flowing between a source and a drain of the field-effect transistor in operation can be controlled.

One embodiment of the present invention is a semiconductor device including a field-effect transistor, a switch, and a capacitor.

The field-effect transistor includes a first gate and a second gate which overlap with each other with a channel formation region therebetween. The threshold voltage of the field-effect transistor varies depending on the potential of the second gate. The field-effect transistor may be a normally-on transistor. For example, the field-effect transistor may be a depletion transistor.

The switch has a function of determining whether electrical connection between one of a source and a drain of the field-effect transistor and the second gate of the field-effect transistor is established.

The capacitor has a function of holding a voltage between the second gate of the field-effect transistor and the other of the source and the drain of the field-effect transistor.

According to one embodiment of the present invention, an effect of preventing an operation defect and/or an effect of reducing an influence of fluctuation in threshold voltage of a field-effect transistor can be obtained.

DETAILED DESCRIPTION OF THE INVENTION

Embodiment according to the present invention will be described below. Note that it will be readily appreciated by those skilled in the art that details of the embodiments can be modified in various ways without departing from the spirit and scope of the present invention. Thus, the present invention should not be limited to the description of the following embodiments.

Note that part of or all the contents (for example, the content shown in the specification or the drawings) in one embodiment can be combined with part of or all the contents in any of the other embodiments as appropriate. In addition, part of the contents in one embodiment can be replaced with part of the contents in any of the other embodiments as appropriate.

Further, the ordinal numbers such as "first" and "second" are used to avoid confusion between components and do not limit the number of components.

Embodiment 1

In this embodiment, an example of a semiconductor device including a field-effect transistor having two gates will be described with reference to FIGS. 1A, 1B-1, 1B-2, and 1B-3.

Figure 1A:
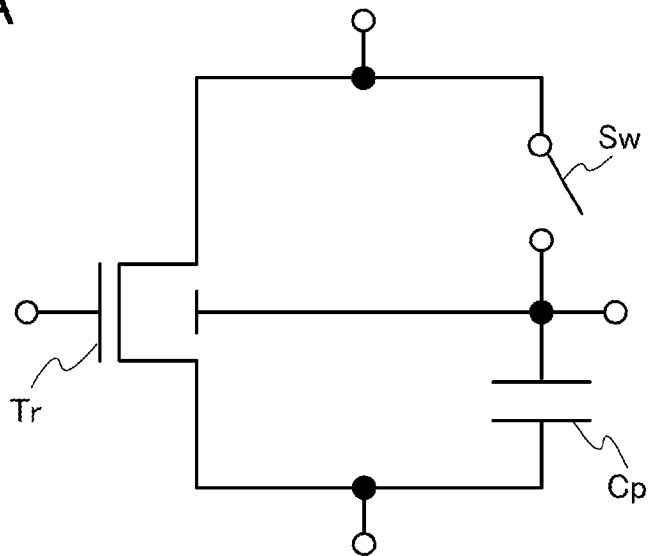
FIGS. 1A, 1B-1, 1B-2, and 1B-3 illustrate an example of a semiconductor device.

A semiconductor device in FIG. 1A includes a field-effect transistor Tr, a switch Sw, and a capacitor Cp.

The field-effect transistor Tr includes a first gate and a second gate. In the field-effect transistor Tr, the first gate and the second gate overlap with each other with a channel formation region therebetween. The threshold voltage of the field-effect transistor Tr depends on the potential of the second gate.

As the field-effect transistor Tr, an enhancement or depletion field-effect transistor can be used.

The switch Sw has a function of determining whether electrical connection between one of a source and a drain of the field-effect transistor Tr and the second gate of the field-effect transistor Tr is established.

The capacitor Cp has a function of holding a voltage between the second gate of the field-effect transistor Tr and the other of the source and the drain of the field-effect transistor Tr.

Next, as an example of a method of driving the semiconductor device of this embodiment, a method of driving the semiconductor device in FIG. 1A will be described with reference to FIGS. 1B-1 to 1B-3. Note that here, a description is given of the case where the field-effect transistor Tr is a depletion n-channel transistor, as one example.

Figures 1, 1B:
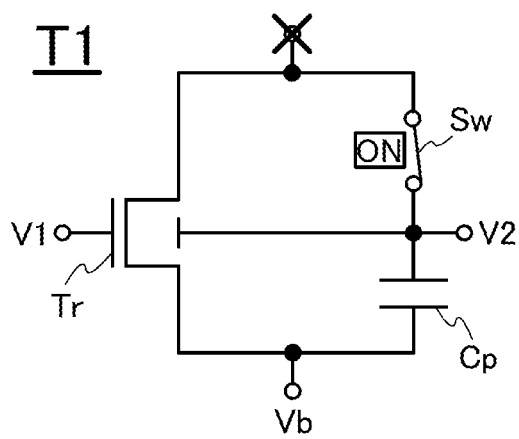
Figures 1, 1B, 2:
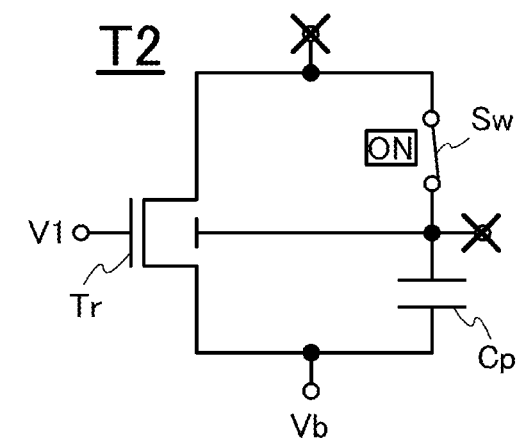
Figures 1, 1B, 2, 3:
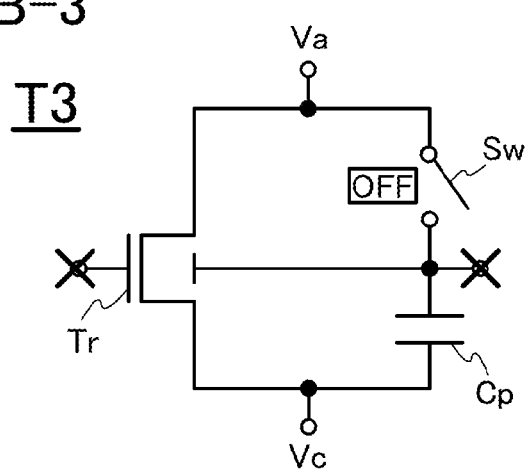

In the method of driving the semiconductor device in FIG. 1A, the switch Sw is turned on (brought into an on state) in a period T1 as illustrated in FIG. 1B-1. The first gate of the field-effect transistor Tr is supplied with a potential V1. Further, the second gate of the field-effect transistor Tr is supplied with a potential V2. Furthermore, the other of the source and the drain of the field-effect transistor Tr is supplied with a potential Vb. Note that the value of V2 is larger than the value of V1−Vb.

At this time, electrical connection between the second gate and the drain of the field-effect transistor Tr is established so that the potential of the second gate and that of the drain of the field-effect transistor Tr each become the potential V2. Accordingly, depending on the potential V2, the threshold voltage (also referred to as Vth) of the field-effect transistor Tr is negatively shifted.

For example, when the threshold voltage of the field-effect transistor Tr in an initial state is assumed to be Vth0, the threshold voltage of the field-effect transistor Tr in the period T1 is Vth0−ΔVth. In this case, the value of ΔVth depends on the value of the potential V2. Accordingly, the value of the threshold voltage of the field-effect transistor Tr varies depending on the value of the potential V2.

A voltage between the first gate and the source (this voltage is also referred to as Vgs) of the field-effect transistor Tr becomes V1−Vb. At this time, the value of V1−Vb is larger than the threshold voltage of the field-effect transistor Tr in the period T1. Accordingly, the field-effect transistor Tr is turned on.

Next, in a period T2, the switch Sw is turned on. Further, the first gate of the field-effect transistor Tr is supplied with the potential V1. Furthermore, the second gate of the field-effect transistor Tr is brought into a floating state.

At this time, the field-effect transistor Tr remains on. Accordingly, current flows between the source and the drain of the field-effect transistor Tr, so that the potential of the second gate of the field-effect transistor Tr is changed. As a result, the threshold voltage of the field-effect transistor Tr is positively shifted, and the field-effect transistor Tr is turned off at the time when the threshold voltage of the field-effect transistor Tr becomes V1−Vb or higher. In this manner, the data of the threshold voltage of the field-effect transistor Tr can be obtained.

Next, in a period T3, the switch Sw is turned off. Further, the potential of the first gate of the field-effect transistor Tr is set to V1+Vsig, so that the first gate of the field-effect transistor Tr is brought into a floating state. Note that Vsig represents the potential of a data signal. Furthermore, the second gate of the field-effect transistor Tr is brought into a floating state. The one of the source and the drain of the field-effect transistor Tr is supplied with a potential Va.

At this time, the field-effect transistor Tr is turned on, and current flows between the source and the drain of the field-effect transistor Tr. At this time, the potential of the other of the source and the drain of the field-effect transistor Tr is set to a potential Vc.

For example, in the case where the field-effect transistor Tr operates in a saturation region, the value of current flowing between the source and the drain (Ids) of the field-effect transistor Tr depends on the value of the data signal input to the first gate, regardless of the threshold voltage of the field-effect transistor Tr. Accordingly, for example, in the case where Vgs is larger than V1−Vb, the field-effect transistor Tr is turned on; thus, current flows between the source and the drain.

Even in the case where the potential of the other of the source and the drain of the field-effect transistor Tr is changed due to deterioration of the field-effect transistor Tr or the like, a voltage between the first gate and the source of the field-effect transistor Tr can be prevented from being changed because the first gate and the second gate of the field-effect transistor Tr are in a floating state and the capacitor Cp is provided.

Note that a mobility correction period may be provided between the period T2 and the period T3 and the potential of the second gate of the field-effect transistor Tr may be set depending on the mobility of the field-effect transistor Tr. Accordingly, an influence of fluctuation in mobility of the field-effect transistor Tr can be prevented.

The above is the description of the example of a method of driving the semiconductor device in this embodiment.

As described with reference to FIGS. 1A, 1B-1, 1B-2, and 1B-3, in an example of the semiconductor device in this embodiment, a period during which the data of the threshold voltage is obtained (e.g., the period T2) is provided so that the data of the threshold voltage of the field-effect transistor is obtained in advance. Accordingly, the amount of current flowing between the source and the drain of the field-effect transistor can be determined regardless of the threshold voltage of the field-effect transistor; thus, an influence of fluctuation in threshold voltage of the field-effect transistor can be prevented. Further, an influence of deterioration of the field-effect transistor can be prevented.

In an example of the semiconductor device in this embodiment, the field-effect transistor including the first gate and the second gate which overlap with each other with the channel formation region therebetween is used. With such a structure, even in the case where the field-effect transistor is a depletion transistor, the data of the threshold voltage of the field-effect transistor can be obtained. The reason of this is as follows: since the threshold voltage of the field-effect transistor can be shifted in response to the potential of the second gate, the field-effect transistor can be off even when the field-effect transistor is an n-channel transistor, the threshold voltage of the field-effect transistor in the initial state is a negative value and thus the field-effect transistor is a normally-on transistor, and a voltage between the first gate and the source of the field-effect transistor is not a negative value. Accordingly, the amount of current flowing between the source and the drain of the field-effect transistor can be determined regardless of the threshold voltage of the field-effect transistor; thus, an influence of fluctuation in threshold voltage of the field-effect transistor can be prevented.

As described above, in an example of the semiconductor device in this embodiment, the amount of current flowing between the source and the drain of the field-effect transistor can be controlled, and thus an operation defect can be prevented.

Embodiment 2

In this embodiment, an example of a light-emitting device including a field-effect transistor having two gates will be described with reference to FIGS. 2A to 2C, FIGS. 3A to 3C, FIGS. 4A to 4C, FIGS. 5A and 5B, and FIGS. 6A and 6B.

Figure 2A:
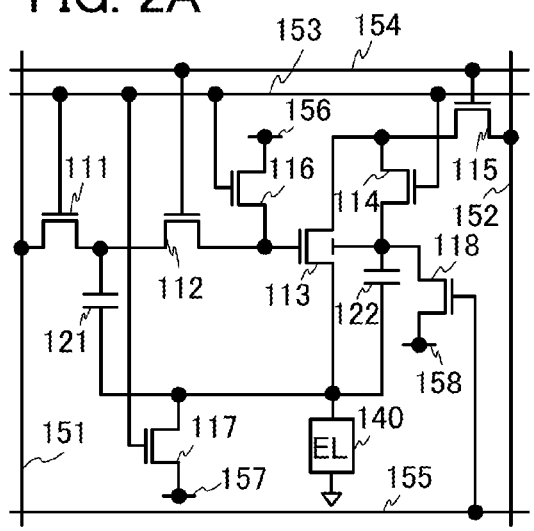
FIGS. 2A to 2C each illustrate an example of a light-emitting device.

A light-emitting device in FIG. 2A includes wirings 151 to 158, field-effect transistors 111 to 118, capacitors 121 and 122, and a light-emitting element (also referred to as EL) 140.

The wiring 151 functions as a data signal line for supplying a data signal or the like.

The wiring 152 functions as a potential supply line for supplying a potential or the like.

The wiring 153 functions as a gate signal line for supplying a gate signal, which is a pulse signal, or the like.

The wiring 154 functions as a gate signal line for supplying a gate signal, which is a pulse signal, or the like.

The wiring 155 functions as a gate signal line for supplying a gate signal, which is a pulse signal, or the like.

The wiring 156 functions as a potential supply line for supplying a potential or the like.

The wiring 157 functions as a potential supply line for supplying a potential or the like.

The wiring 158 functions as a potential supply line for supplying a potential or the like.

One of a source and a drain of the field-effect transistor 111 is electrically connected to the wiring 151. A gate of the field-effect transistor 111 is electrically connected to the wiring 153.

One of a source and a drain of the field-effect transistor 112 is electrically connected to the other of the source and the drain of the field-effect transistor 111. A gate of the field-effect transistor 112 is electrically connected to the wiring 154.

One of a pair of electrodes of the capacitor 121 is electrically connected to the other of the source and the drain of the field-effect transistor 111.

The field-effect transistor 113 includes a first gate and a second gate which overlap with each other with a channel formation region therebetween. The first gate of the field-effect transistor 113 is electrically connected to the other of the source and the drain of the field-effect transistor 112.

One of a source and a drain of the field-effect transistor 114 is electrically connected to one of a source and a drain of the field-effect transistor 113. The other of the source and the drain of the field-effect transistor 114 is electrically connected to the second gate of the field-effect transistor 113. A gate of the field-effect transistor 114 is electrically connected to the wiring 153.

One of a pair of electrodes of the capacitor 122 is electrically connected to the second gate of the field-effect transistor 113. The other of the pair of electrodes of the capacitor 122 is electrically connected to the other of the source and the drain of the field-effect transistor 113.

One of a source and a drain of the field-effect transistor 115 is electrically connected to the wiring 152. The other of the source and the drain of the field-effect transistor 115 is electrically connected to the one of the source and the drain of the field-effect transistor 113. A gate of the field-effect transistor 115 is electrically connected to the wiring 154.

One of a source and a drain of the field-effect transistor 116 is electrically connected to the wiring 156. The other of the source and the drain of the field-effect transistor 116 is electrically connected to the first gate of the field-effect transistor 113. A gate of the field-effect transistor 116 is electrically connected to the wiring 153.

One of a source and a drain of the field-effect transistor 117 is electrically connected to the wiring 157. The other of the source and the drain of the field-effect transistor 117 is electrically connected to the other of the pair of electrodes of the capacitor 121 and the other of the pair of electrodes of the capacitor 122. A gate of the field-effect transistor 117 is electrically connected to the wiring 153.

One of a source and a drain of the field-effect transistor 118 is electrically connected to the wiring 158. The other of the source and the drain of the field-effect transistor 118 is electrically connected to the second gate of the field-effect transistor 113. A gate of the field-effect transistor 118 is electrically connected to the wiring 155.

One of an anode and a cathode of the light-emitting element 140 is electrically connected to the other of the source and the drain of the field-effect transistor 113. As the light-emitting element 140, for example, an electroluminescent element (also referred to as EL element) can be used.

Figure 2B:
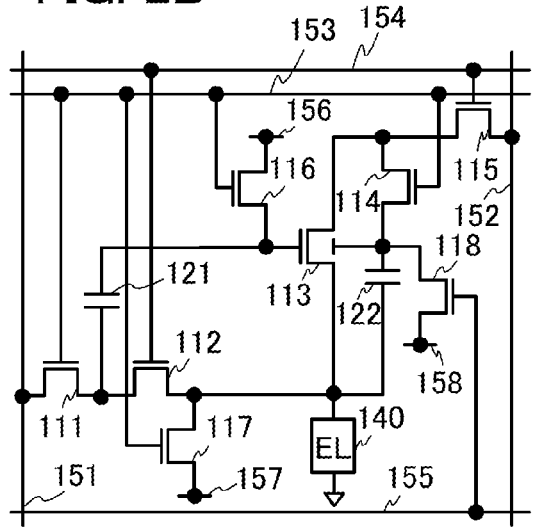

A light-emitting device in FIG. 2B is different from the light-emitting device in FIG. 2A in a connection relation of the field-effect transistor 113 and a connection relation of the field-effect transistor 117.

In the light-emitting device in FIG. 2B, the other of the source and the drain of the field-effect transistor 113 is electrically connected to the other of the source and the drain of the field-effect transistor 112. The first gate of the field-effect transistor 113 is electrically connected to the other of the pair of electrodes of the capacitor 121. Furthermore, the other of the source and the drain of the field-effect transistor 117 is electrically connected to the other of the source and the drain of the field-effect transistor 112 and the other of the pair of electrodes of the capacitor 122.

Figure 2C:
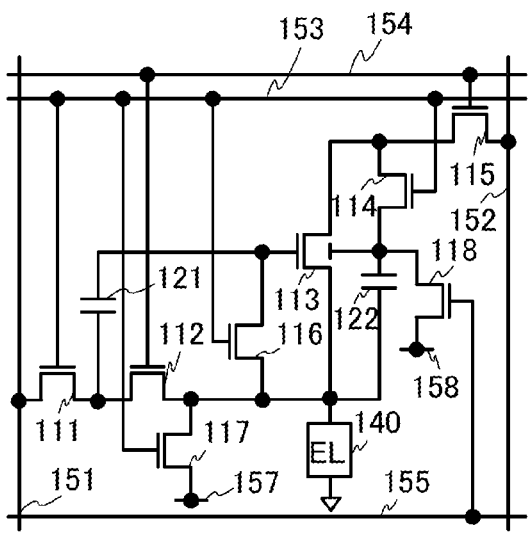

A connection relation of the field-effect transistor 116 in the light-emitting device in FIG. 2C is different from that in the light-emitting device in FIG. 2B. Further, the wiring 156 is not provided in the light-emitting device in FIG. 2C unlike in the light-emitting device in FIG. 2A.

In the light-emitting device in FIG. 2C, the one of the source and the drain of the field-effect transistor 116 is electrically connected to the first gate of the field-effect transistor 113. The other of the source and the drain of the field-effect transistor 116 is electrically connected to the other of the pair of electrodes of the capacitor 122. Note that the field-effect transistor 113 may be an enhancement transistor.

With the structure in FIG. 2C, the number of wirings can be made smaller.

Figure 3A:
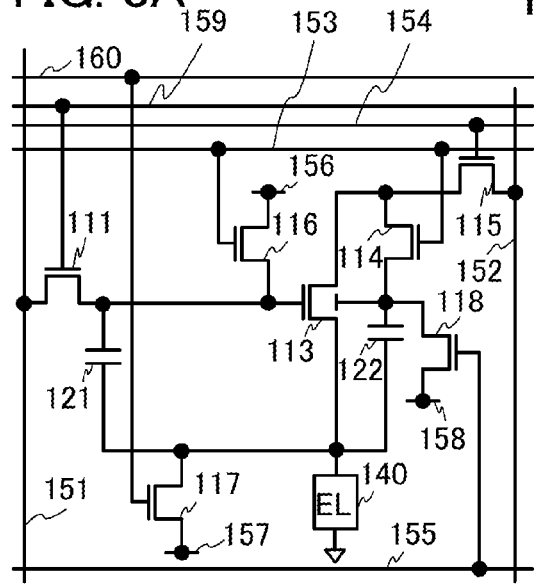
FIGS. 3A to 3C each illustrate an example of a light-emitting device.

A light-emitting device in FIG. 3A has the structure in FIG. 2A, and in addition, includes a wiring 159 and a wiring 160; thus, a connection relation of the field-effect transistor 111 and a connection relation of the field-effect transistor 117 in FIG. 3A are different from those in FIG. 2A. Further, the field-effect transistor 112 is not provided in the light-emitting device in FIG. 3A unlike in the light-emitting device in FIG. 2A.

In the light-emitting device in FIG. 3A, the gate of the field-effect transistor 111 is electrically connected to the wiring 159. The first gate of the field-effect transistor 113 is electrically connected to the other of the source and the drain of the field-effect transistor 111. The gate of the field-effect transistor 117 is electrically connected to the wiring 160.

Figure 3B:
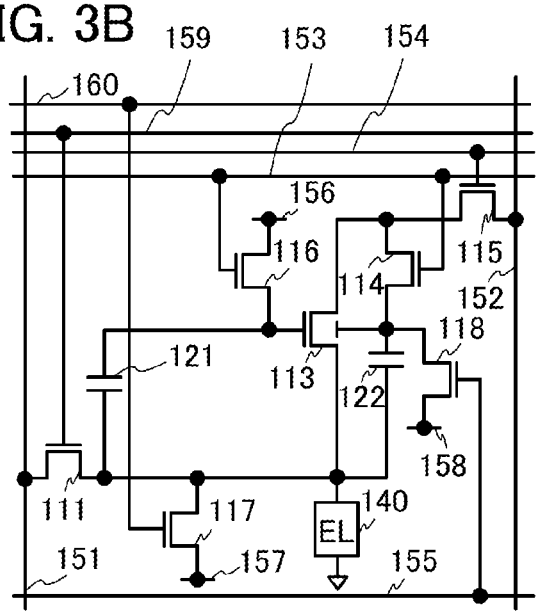

A connection relation of the capacitor 121 in a light-emitting device in FIG. 3B is different from that in the light-emitting device in FIG. 3A.

In the light-emitting device in FIG. 3B, the other of the pair of electrodes of the capacitor 121 is electrically connected to the other of the source and the drain of the field-effect transistor 111.

Figure 3C:
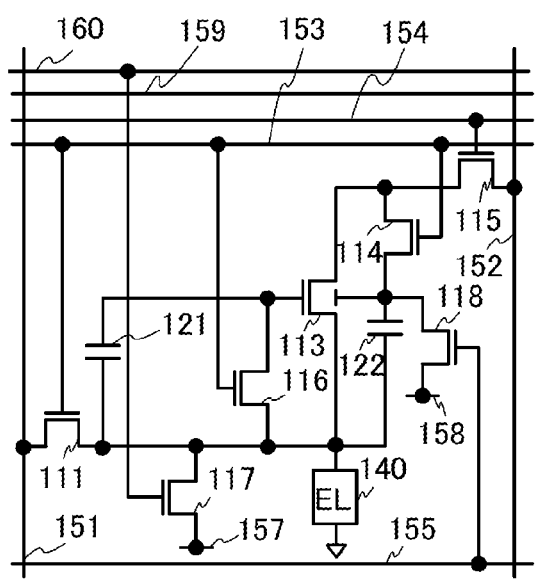

A connection relation of the field-effect transistor 116 in the light-emitting device in FIG. 3C is different from that in the light-emitting device in FIG. 3B. Further, the wiring 156 is not provided in the light-emitting device in FIG. 3C unlike in the light-emitting device in FIG. 3B.

In the light-emitting device in FIG. 3C, the one of the source and the drain of the field-effect transistor 116 is electrically connected to the first gate of the field-effect transistor 113. The other of the source and the drain of the field-effect transistor 116 is electrically connected to the other of the pair of electrodes of the capacitor 122. Note that the field-effect transistor 113 may be an enhancement transistor.

With the structure in FIG. 3C, the number of wirings can be made smaller.

With any of the structures in FIGS. 3A to 3C, the number of field-effect transistors can be made smaller.

Then, examples of a light-emitting device including a capacitor for adjusting a voltage applied to the light-emitting element 140 will be described with reference to FIGS. 4A to 4C.

Figure 4A:
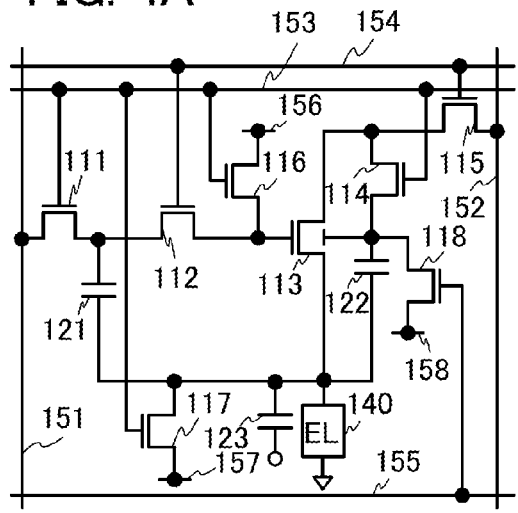
FIGS. 4A to 4C each illustrate an example of a light-emitting device.

A light-emitting device in FIG. 4A has the structure of the light-emitting device in FIG. 2A, and in addition, includes a capacitor 123.

In the light-emitting device in FIG. 4A, one of a pair of electrodes of the capacitor 123 is electrically connected to the one of the anode and the cathode of the light-emitting element 140. A reference potential is supplied to the one of the pair of electrodes of the capacitor 123.

Figure 4B:
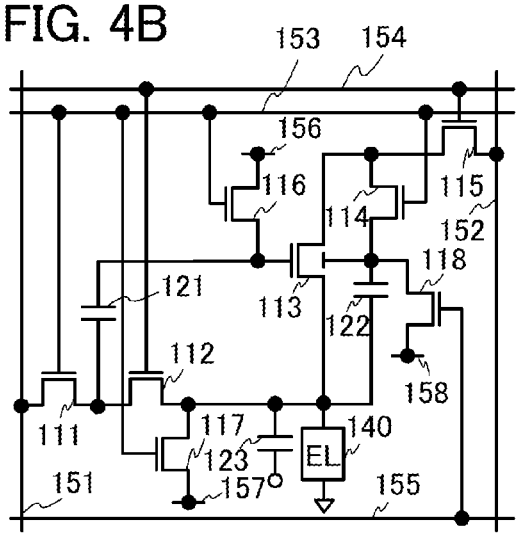

A light-emitting device in FIG. 4B has the structure of the light-emitting device in FIG. 2B, and in addition, includes the capacitor 123. A connection relation of the capacitor 123 in the light-emitting device in FIG. 4B is the same as that in FIG. 4A.

Figure 4C:
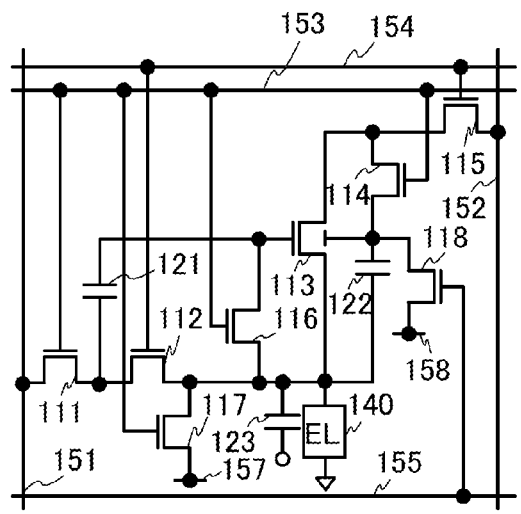

A light-emitting device in FIG. 4C has the structure of the light-emitting device in FIG. 2C, and in addition, includes the capacitor 123. A connection relation of the capacitor 123 in the light-emitting device in FIG. 4C is the same as that in FIG. 4A.

The structure of the light-emitting device is not limited to those in FIGS. 4A to 4C; for example, the light-emitting device in FIG. 3A, FIG. 3B, or FIG. 3C may additionally include a capacitor.

Next, an example of a method of driving the light-emitting device in this embodiment will be described with reference to FIGS. 5A and 5B and FIGS. 6A and 6B.

Figure 5A:
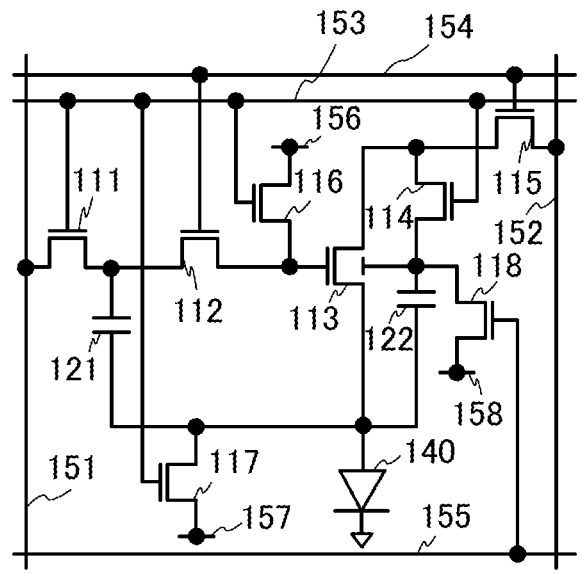
FIGS. 5A and 5B illustrate an example of a light-emitting device.

As an example of a method of driving the light-emitting device in this embodiment, a method of driving a light-emitting device in FIG. 5A will be described with reference to a timing chart in FIG. 5B. The light-emitting device in FIG. 5A is a light-emitting device having a structure where the light-emitting element 140 is a light-emitting diode and the field-effect transistors 111 to 118 are n-channel transistors in the light-emitting device in FIG. 2A. The anode of the light-emitting diode corresponding to the light-emitting element 140 is electrically connected to the other of the pair of electrodes of the capacitor 122. The cathode of the light-emitting diode corresponding to the light-emitting element 140 is supplied with a potential Vx.

Figure 5B:
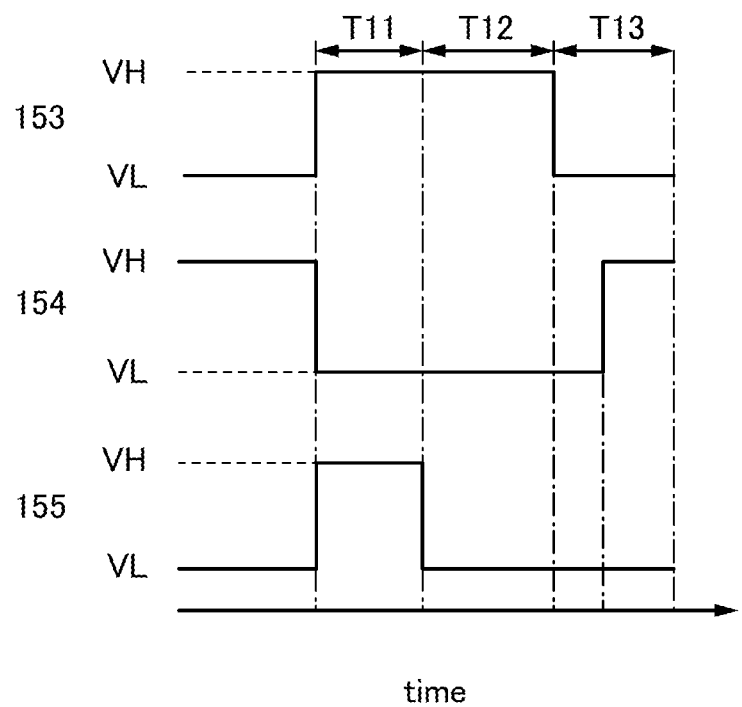

In the example of a method of driving the light-emitting device in FIG. 5A, as shown in FIG. 5B, in a period T11, a high-level (also referred to as VH) signal is input through the wiring 153, a low-level (also referred to as VL) signal is input through the wiring 154, and a high-level signal is input through the wiring 155. A potential V11 is supplied to the wiring 156, a potential V12 is supplied to the wiring 157, and a potential V13 is supplied to the wiring 158. Note that a difference between the potential V11 and the potential V12 is larger than the threshold voltage of the field-effect transistor 113 (also referred to as Vth113). Further, the potential V12 is lower than the potential Vx.

At this time, the field-effect transistors 111, 114, 116, 117, and 118 are turned on, and the field-effect transistors 112 and 115 are turned off.

Electrical connection between the second gate and the drain of the field-effect transistor 113 is established so that the potential of the second gate and that of the drain of the field-effect transistor 113 each become the potential V13. Accordingly, in response to the potential V13, the threshold voltage of the field-effect transistor 113 is negatively shifted.

A voltage between the first gate and the source of the field-effect transistor 113 (this voltage is also referred to as Vgs113) becomes V11–V12. The value of V11–V12 is larger than the threshold voltage of the field-effect transistor 113 at this time. Accordingly, the field-effect transistor 113 is turned on.

Then, in a period T12, a data signal is input through the wiring 151, a high-level signal is input through the wiring 153, a low-level signal is input through the wiring 154, and a low-level signal is input through the wiring 155. The potential V11 is supplied to the wiring 156, and the potential V12 is supplied to the wiring 157.

At this time, the field-effect transistors 111, 114, 116, and 117 are turned on, and the field-effect transistors 112, 115, and 118 are turned off.

The field-effect transistor 113 remains on. Accordingly, current flows between the source and the drain of the field-effect transistor 113, so that the potential of the second gate of the field-effect transistor 113 is changed. As a result, the threshold voltage of the field-effect transistor 113 is positively shifted, and the field-effect transistor 113 is turned off at the time when the threshold voltage of the field-effect transistor 113 becomes V11–V12 or higher. In this manner, the data of the threshold voltage of the field-effect transistor 113 can be obtained.

The potential of the one of the pair of electrodes of the capacitor 121 becomes the potential of the data signal (Vsig) input through the wiring 151.

Then, in a period T13, a low-level signal is input through the wiring 153, a high-level signal is input through the wiring 154, and a low-level signal is input through the wiring 155. The wiring 152 is supplied with a potential Vdd. Note that the value of the potential Vdd is larger than the potential V11. In the period T13, a high-level signal is input through the wiring 154 after a low-level signal is input through the wiring 153; however, one embodiment of the present invention is not limited to this.

At this time, the field-effect transistors 112 and 115 are turned on, and the field-effect transistors 111, 114, 116, 117, and 118 are turned off.

The potential of the first gate of the field-effect transistor 113 varies depending on the data signal. Accordingly, the field-effect transistor 113 is turned on, and thus current flows between the source and the drain of the field-effect transistor 113.

Since current flows between the anode and the cathode of the light-emitting diode corresponding to the light-emitting element 140, the light-emitting diode corresponding to the light-emitting element 140 emits light.

For example, in the case where the field-effect transistor 113 operates in a saturation region, the value of current flowing between the source and the drain (Ids) of the field-effect transistor 113 depends on the value of the data signal input to the first gate, regardless of the threshold voltage of the field-effect transistor 113. Accordingly, for example, in the case where Vgs113 is larger than V11–V12, the field-effect transistor 113 is turned on; thus, current flows between the source and the drain.

Even in the case where the potential of the other of the source and the drain of the field-effect transistor 113 is changed due to deterioration of the field-effect transistor 113 or the like, a voltage between the first gate and the source of the field-effect transistor 113 can be prevented from being changed because the first gate and the second gate of the field-effect transistor 113 are in a floating state and the capacitors 121 and 122 are provided.

Note that a mobility correction period may be provided between the period T12 and the period T13 and the potential of the second gate of the field-effect transistor 113 may be set depending on the mobility of the field-effect transistor 113. Accordingly, an influence of fluctuation in mobility of the field-effect transistor 113 can be prevented.

The above is the description of an example of a method of driving the light-emitting device in FIG. 5A.

Note that one or more of the field-effect transistors 111 to 118 in the semiconductor device in FIG. 5A may be a p-channel transistor.

Figure 6A:
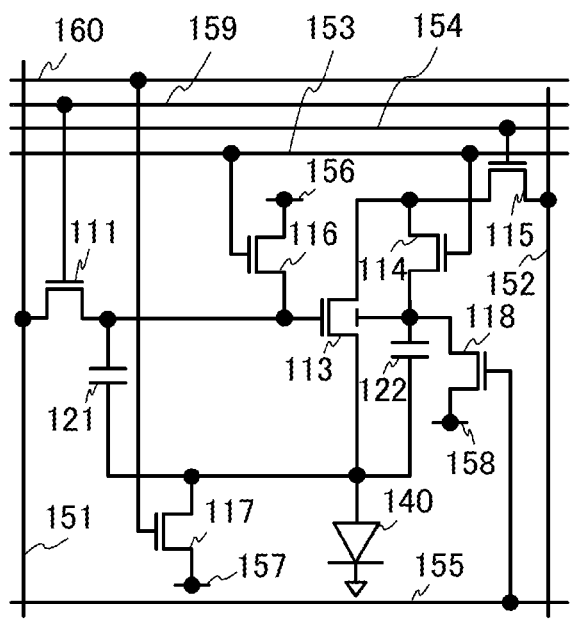
FIGS. 6A and 6B illustrate an example of a light-emitting device.

Next, as an example of a method of driving the light-emitting device in this embodiment, a method of driving a light-emitting device in FIG. 6A will be described with reference to a timing chart in FIG. 6B. The light-emitting device in FIG. 6A is a light-emitting device having a structure where the light-emitting element 140 is a light-emitting diode and the field-effect transistors 111 to 118 are n-channel transistors in the light-emitting device in FIG. 3A. The anode of the light-emitting diode corresponding to the light-emitting element 140 is electrically connected to the other of the pair of electrodes of the capacitor 122. The cathode of the light-emitting diode corresponding to the light-emitting element 140 is supplied with the potential Vx.

Figure 6B:
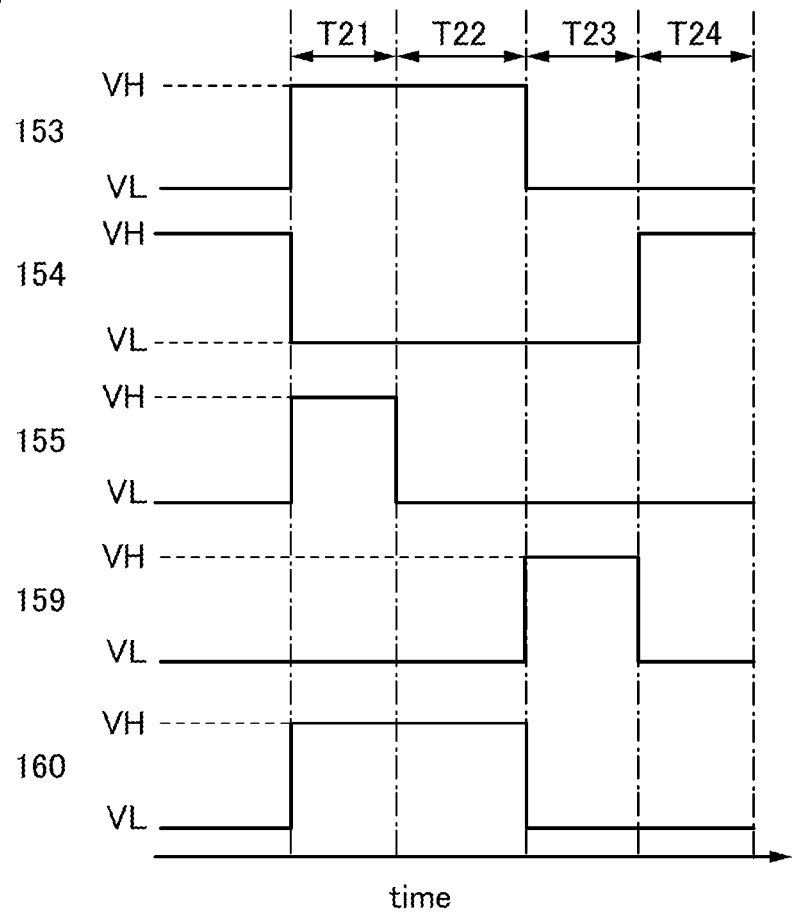

In the example of a method of driving the light-emitting device in FIG. 6A, as shown in FIG. 6B, in a period T21, a high-level signal is input through the wiring 153, a low-level signal is input through the wiring 154, a high-level signal is input through the wiring 155, a low-level signal is input through the wiring 159, and a high-level signal is input through the wiring 160. The potential V11 is supplied to the wiring 156, the potential V12 is supplied to the wiring 157, and the potential V13 is supplied to the wiring 158. Note that a difference between the potential V11 and the potential V12 is larger than the threshold voltage of the field-effect transistor 113. Further, the potential V12 is lower than the potential Vx.

At this time, the field-effect transistors 114, 116, 117, and 118 are turned on, and the field-effect transistors 111 and 115 are turned off.

Electrical connection between the second gate and the drain of the field-effect transistor 113 is established so that the potential of the second gate and that of the drain of the field-effect transistor 113 each become the potential V13. Accordingly, in response to the potential V13, the threshold voltage of the field-effect transistor 113 is negatively shifted.

A voltage between the gate and the source of the field-effect transistor 113 becomes V11–V12. The value of V11–V12 is larger than the threshold voltage of the field-effect transistor 113 at this time. Accordingly, the field-effect transistor 113 is turned on.

In a period T22, a high-level signal is input through the wiring 153, a low-level signal is input through the wiring 154, a low-level signal is input through the wiring 155, a low-level signal is input through the wiring 159, and a high-level signal is input through the wiring 160. The potential V11 is supplied to the wiring 156, and the potential V12 is supplied to the wiring 157.

At this time, the field-effect transistors 114, 116, and 117 are turned on, and the field-effect transistors 111, 115, and 118 are turned off.

At this time, the field-effect transistor 113 remains on. Accordingly, current flows between the source and the drain of the field-effect transistor 113, so that the potential of the second gate of the field-effect transistor 113 is changed. As a result, the threshold voltage of the field-effect transistor 113 is positively shifted, and the field-effect transistor 113 is turned off at the time when the threshold voltage of the field-effect transistor 113 becomes V11–V12 or higher. In this manner, the data of the threshold voltage of the field-effect transistor 113 can be obtained.

Then, in a period T23, a low-level signal is input through the wiring 153, a low-level signal is input through the wiring 154, a low-level signal is input through the wiring 155, a high-level signal input through the wiring 159, and a low-level signal is input through the wiring 160. The data signal is input through the wiring 151.

At this time, the field-effect transistor 111 is turned on, and the field-effect transistors 114, 115, 116, 117, and 118 are turned off.

At this time, the potential of the first gate of the field-effect transistor 113 varies depending on the potential of the data signal (Vsig).

Then, in a period T24, a low-level signal is input through the wiring 153, a high-level signal is input through the wiring 154, a low-level signal is input through the wiring 155, a low-level signal input through the wiring 159, and a low-level signal input through the wiring 160. The potential Vdd is supplied through the wiring 152. Note that the value of the potential Vdd is larger than the potential V11.

At this time, the field-effect transistor 115 is turned on, and the field-effect transistors 111, 114, 116, 117, and 118 are turned off.

Further, the field-effect transistor 113 is turned on, and thus current flows between the source and the drain of the field-effect transistor 113.

Since current flows between the anode and the cathode of the light-emitting diode corresponding to the light-emitting element 140, the light-emitting diode corresponding to the light-emitting element 140 emits light.

For example, in the case where the field-effect transistor 113 operates in a saturation region, the value of current flowing between the source and the drain (Ids) of the field-effect transistor 113 depends on the value of the data signal (Vsig) input to the first gate, regardless of the threshold voltage of the field-effect transistor 113. Accordingly, for example, in the case where Vgs113 is larger than V11–V12, the field-effect transistor 113 is turned on; thus, current flows between the source and the drain.

Even in the case where the potential of the other of the source and the drain of the field-effect transistor 113 is changed due to deterioration of the field-effect transistor 113 or the like, a voltage between the first gate and the source of the field-effect transistor 113 can be prevented from being changed because the first gate and the second gate of the field-effect transistor 113 are in a floating state and the capacitors 121 and 122 are provided.

Note that a mobility correction period may be provided between the period T23 and the period T24 and the potential of the second gate of the field-effect transistor 113 may be set depending on the mobility of the field-effect transistor 113. Accordingly, an influence of fluctuation in mobility of the field-effect transistor 113 can be prevented.

Note that one or more of the field-effect transistors 111 to 118 in the semiconductor device in FIG. 6A may be a p-channel transistor.

The above is the description of an example of a method of driving the light-emitting device in FIG. 6A.

As described with reference to FIGS. 5A and 5B and FIGS. 6A and 6B, in an example of the light-emitting device in this embodiment, a period during which the data of the threshold voltage is obtained is provided so that the data of the threshold voltage of the field-effect transistor is obtained in advance. Accordingly, the amount of current flowing between the source and the drain of the field-effect transistor can be determined regardless of the threshold voltage of the field-effect transistor; thus, an influence of fluctuation in threshold voltage of the field-effect transistor can be prevented. Further, an influence of deterioration of the field-effect transistor can be prevented.

In an example of the light-emitting device in this embodiment, the field-effect transistor including the first gate and the second gate is used. With such a structure, even in the case where the field-effect transistor is a depletion transistor, the data of the threshold voltage of the field-effect transistor can be obtained. The reason of this is as follows: since the threshold voltage of the field-effect transistor can be shifted in response to the potential of the second gate, the field-effect transistor can be off even when the field-effect transistor is an n-channel transistor, the threshold voltage of the field-effect transistor in the initial state is a negative value and thus the field-effect transistor is a normally-on transistor, and a voltage between the first gate and the source of the field-effect transistor is not a negative value. Accordingly, the amount of current flowing between the source and the drain of the field-effect transistor can be determined regardless of the threshold voltage of the field-effect transistor; thus, an influence of fluctuation in threshold voltage of the field-effect transistor can be prevented.

As described above, in an example of the light-emitting device in this embodiment, the amount of current flowing between the source and the drain of the field-effect transistor can be controlled, and thus an operation defect can be prevented.

Embodiment 3

In this embodiment, a structure example of a light-emitting device including a driver circuit will be described with reference to FIG. 7.

Figure 7:
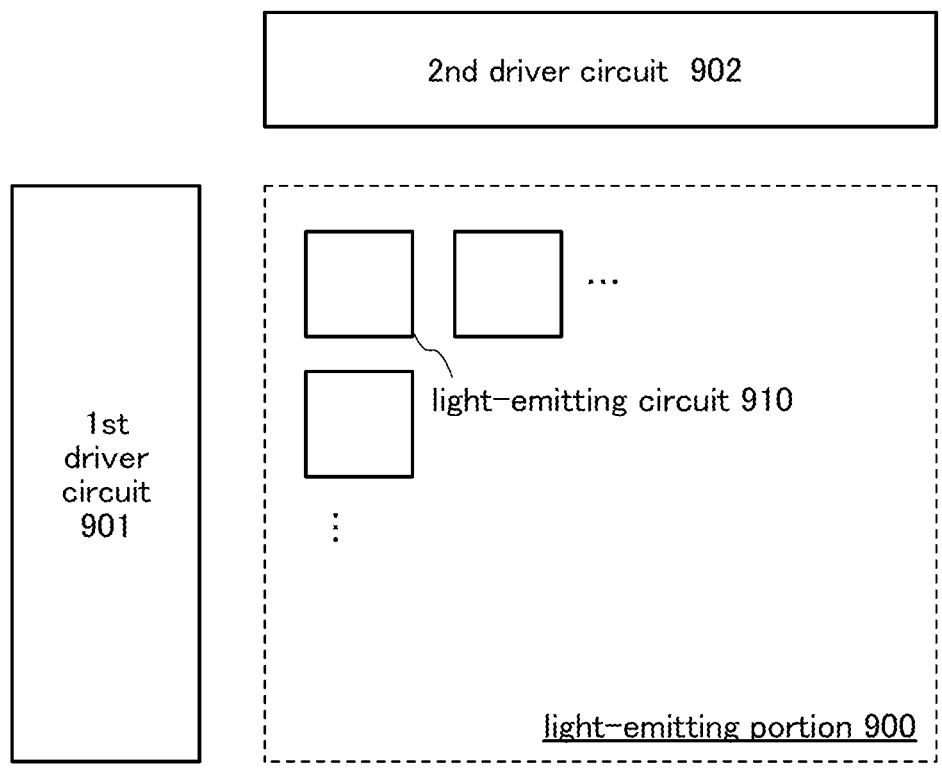
FIG. 7 illustrates an example of a light-emitting device.

A semiconductor device in FIG. 7 includes a first driver circuit 901, a second driver circuit 902, and a plurality of light-emitting circuits 910.

The first driver circuit 901 has a function of controlling light-emitting operation of the light-emitting circuits 910.

The first driver circuit 901 is formed using a shift register, for example.

The second driver circuit 902 has a function of controlling light-emitting operation of the light-emitting circuits 910.

The second driver circuit 902 is formed using a shift register or an analog switch, for example.

The plurality of light-emitting circuits 910 is arranged in a matrix in a light-emitting portion 900. For the light-emitting circuits 910, the structure of the light-emitting device in Embodiment 2 can be employed. In this case, a signal is supplied from the first driver circuit 901 to the wiring electrically connected to the gate of the field-effect transistor in the light-emitting device in Embodiment 2. Further, a data signal is supplied from the second driver circuit 902 to the wiring to which the data signal is input in the light-emitting device in Embodiment 2.

Note that the first driver circuit 901 may be provided over the same substrate as the light-emitting circuits 910.

The above is the description of the structure example of the light-emitting device in FIG. 7.

As described with reference to FIG. 7, in an example of the light-emitting device in this embodiment, light-emitting operation of the light-emitting circuits can be controlled by the first driver circuit and the second driver circuit.

Embodiment 4

In this embodiment, an example of a field-effect transistor that can be used in the semiconductor device or the light-emitting device in any of the above embodiments will be described.

Structure examples of field-effect transistors in this embodiment will be described with reference to FIGS. 8A and 8B.

Figure 8A:
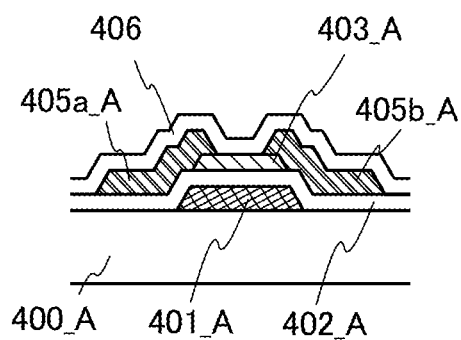
FIGS. 8A and 8B each illustrate an example of a field-effect transistor.

A field-effect transistor in FIG. 8A includes, over an element formation layer 400_A, a conductive layer 401_A, an insulating layer 402_A, a semiconductor layer 403_A, a conductive layer 405a_A, a conductive layer 405b_A, and an insulating layer 406.

Figure 8B:
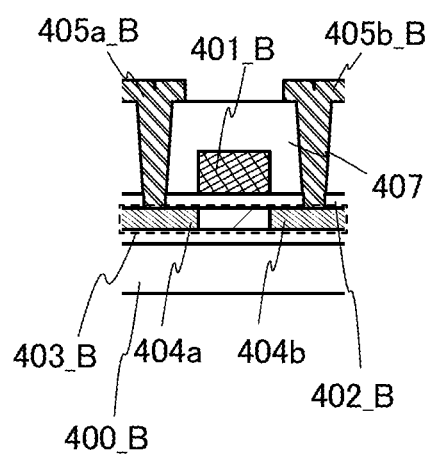

A field-effect transistor in FIG. 8B includes, over an element formation layer 400_B, a conductive layer 401_B, an insulating layer 402_B, a semiconductor layer 403_B including regions 404a and 404b, a conductive layer 405a B, a conductive layer 405b_B, and an insulating layer 407.

Next, the components illustrated in FIGS. 8A and 8B will be described.

As the element formation layers 400_A and 400_B, insulating layers or substrates having insulating surfaces can be used, for example.

Each of the conductive layers 401_A and 401_B functions as a gate of the field-effect transistor. Note that a layer functioning as a gate of the field-effect transistor can be called gate electrode or gate wiring.

As the conductive layers 401_A and 401_B, it is possible to use, for example, a layer (single layer or stack of layers) including a metal material such as molybdenum, magnesium, titanium, chromium, tantalum, tungsten, aluminum, copper, neodymium, or scandium or an alloy material containing any of these materials as a main component.

Each of the insulating layers 402_A and 402_B functions as a gate insulating layer of the field-effect transistor.

Each of the insulating layers 402_A and 402_B can be formed using, for example, a layer (single layer or stack of layers) including a material such as silicon oxide, silicon nitride, silicon oxynitride, silicon nitride oxide, aluminum oxide, aluminum nitride, aluminum oxynitride, aluminum nitride oxide, hafnium oxide, or lanthanum oxide.

Alternatively, as the insulating layers 402_A and 402_B, an insulating layer of a material containing, for example, an element that belongs to Group 13 in the periodic table and oxygen can be used.

Examples of the material containing a Group 13 element and oxygen include gallium oxide, aluminum oxide, aluminum gallium oxide, and gallium aluminum oxide. Note that the amount of aluminum is larger than that of gallium in atomic percent in aluminum gallium oxide, whereas the amount of gallium is larger than that of aluminum in atomic percent in gallium aluminum oxide.

Each of the semiconductor layers 403_A and 403_B functions as a layer in which a channel of the field-effect transistor is formed (also referred to as channel formation layer), that is, a layer including a channel formation region. For the semiconductor layers 403_A and 403_B, a semiconductor containing an element that belongs to Group 14 in the periodic table (e.g., silicon) can be used, for example. For example, a semiconductor layer containing silicon may be a single crystal semiconductor layer, a polycrystalline semiconductor layer, a microcrystalline semiconductor layer, or an amorphous semiconductor layer.

For the semiconductor layers 403_A and 403_B, a semiconductor having a wider bandgap than silicon, for example, a bandgap of 2 eV or more, preferably 2.5 eV or more, and further preferably 3 eV or more can be used, for example. For example, for the semiconductor layers 403_A and 403_B, an oxide semiconductor of metal oxide such as an In-based oxide (e.g., indium oxide), a Sn-based oxide (e.g., tin oxide), or a Zn-based oxide (e.g., zinc oxide) can be used.

As the metal oxide, a four-component metal oxide, a three-component metal oxide, or a two-component metal oxide can also be used, for example. Note that a metal oxide that can be used as the above oxide semiconductor may include gallium as a stabilizer for reducing variation in characteristics. A metal oxide that can be used as the above oxide semiconductor may include tin as the stabilizer. A metal oxide that can be used as the above oxide semiconductor may include hafnium as the stabilizer. A metal oxide that can be used as the above oxide semiconductor may include aluminum as the stabilizer. A metal oxide that can be used as the above oxide semiconductor may include one or more of the following materials as the stabilizer: lanthanum, cerium, praseodymium, neodymium, samarium, europium, gadolinium, terbium, dysprosium, holmium, erbium, thulium, ytterbium, and lutetium, which are lanthanoid. Further, the metal oxide that can be used as the oxide semiconductor may contain silicon oxide.

Examples of the four-component metal oxide include an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, and an In—Hf—Al—Zn-based oxide.

Examples of the three-component metal oxide include an In—Ga—Zn-based oxide, an In—Sn—Zn-based oxide, an In—Al—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, and an In—Lu—Zn-based oxide.

Examples of the two-component metal oxide include an In—Zn-based oxide, a Sn—Zn-based oxide, an Al—Zn-based oxide, a Zn—Mg-based oxide, a Sn—Mg-based oxide, an In—Mg-based oxide, an In—Sn-based oxide, and an In—Ga-based oxide.

As the oxide semiconductor, a material represented by $InLO_3(ZnO)_m$ (m is larger than 0) can be used. Here, L in $InLO_3(ZnO)_m$ represents one or more metal elements selected from Ga, Al, Mn, and Co.

For example, as the oxide semiconductor, an In—Ga—Zn-based oxide with an atomic ratio of In:Ga:Zn=1:1:1 ($=\frac{1}{3}:\frac{1}{3}:\frac{1}{3}$) or In:Ga:Zn=2:2:1 ($=\frac{2}{5}:\frac{2}{5}:\frac{1}{5}$), or any of oxides whose composition is in the neighborhood of the above compositions can be used. Moreover, as the oxide semiconductor, an In—Sn—Zn-based oxide with an atomic ratio of In:Sn:Zn=1:1:1 ($=\frac{1}{3}:\frac{1}{3}:\frac{1}{3}$), In:Sn:Zn=2:1:3 ($=\frac{1}{3}:\frac{1}{6}:\frac{1}{2}$), or In:Sn:Zn=2:1:5 ($=\frac{1}{4}:\frac{1}{8}:\frac{5}{8}$) or any of oxides whose composition is in the neighborhood of the above compositions can be used. For example, a sputtering target with which the semiconductor layers to be formed have the above composition is preferably used for forming the semiconductor layers.

In the case where the semiconductor layers 403_A and 403_B are formed using an oxide semiconductor, the semiconductor layers may be in a single crystal state, a polycrystalline (also referred to as polycrystal) state, or an amorphous state.

As the semiconductor layers 403_A and 403_B, an oxide semiconductor layer including a c-axis aligned crystalline oxide semiconductor (CAAC-OS) may be used.

In the CAAC-OS, a mixed phase structure including a crystal region and an amorphous region is formed. Further, in a crystal in the crystal region, the direction of the c-axis is perpendicular to a surface where the semiconductor layer is formed or a surface of the semiconductor layer, triangular or hexagonal atomic arrangement which is seen from the direction perpendicular to the a-b plane is formed, and metal atoms are arranged in a layered manner or metal atoms and oxygen atoms are arranged in a layered manner when seen from the direction perpendicular to the c-axis. Therefore, the CAAC-OS is not completely single crystal or completely amorphous. Note that in the case where the CAAC-OS has a plurality of crystal regions, the directions of the a-axis and the b-axis may vary among different crystals of the plurality of crystal regions.

The size of a crystal in the crystal region in the CAAC-OS is estimated to be about several nanometers to several tens of nanometers. However, in observation of the CAAC-OS with a transmission electron microscope (also referred to as TEM), a boundary between a crystal region and an amorphous region in the CAAC-OS is not necessarily clear. A grain boundary is not found in the CAAC-OS. Thus, since the CAAC-OS includes a region having no grain boundary, a reduction in electron mobility due to the grain boundary is less likely to be caused.

In the CAAC-OS, distribution of the crystal regions is not necessarily uniform. For example, in the case where crystal growth occurs from a surface side of an oxide semiconductor layer to form an oxide semiconductor layer including CAAC-OS, in some cases, the proportion of crystal regions in the vicinity of a surface of the CAAC-OS of the oxide semiconductor layer is high and the proportion of amorphous regions in the vicinity of a surface where the CAAC-OS of the oxide semiconductor layer is formed is high.

Since the c-axes of crystals in the crystal regions in the CAAC-OS are perpendicular to the surface where the CAAC-OS of the oxide semiconductor layer is formed or the surface of the CAAC-OS of the oxide semiconductor layer, the directions of the c-axes may be different from each other depending on the shape of the CAAC-OS of the oxide semiconductor layer (the cross-sectional shape of the surface where the CAAC-OS of the oxide semiconductor layer is formed or the surface of the CAAC-OS of the oxide semiconductor layer). Note that the c-axes in the crystal regions in the CAAC-OS are substantially perpendicular to the surface where the CAAC-OS of the oxide semiconductor layer is formed or the surface of the CAAC-OS of the oxide semiconductor layer.

In the CAAC-OS, nitrogen may be substituted for part of oxygen.

It is preferable that the composition of the crystal regions in the CAAC-OS be represented by $In_{1+\sigma}Ga_{1-\sigma}O_3(ZnO)_M$ ($0<\sigma<1$ and M=1 to 3), and the composition of the entire CAAC-OS be represented by $In_PGa_QO_R(ZnO)_M$ ($0<P<2$, $0<Q<2$, and M=1 to 3).

In the case where an oxide semiconductor layer including a CAAC-OS is used, a layer below and in contact with the oxide semiconductor layer is preferably flat. For example, the average surface roughness of the layer below and in contact with the oxide semiconductor layer including the CAAC-OS is 1 nm or less, preferably 0.3 nm or less. When the flatness of the layer below and in contact with the oxide semiconductor layer including the CAAC-OS is improved, the mobility can be made higher than that of an oxide semiconductor of only an amorphous component. For example, the layer below and in contact with the oxide semiconductor layer including the CAAC-OS can be planarized by one of or both chemical mechanical polishing (CMP) and plasma treatment. The plasma treatment includes treatment of sputtering rare gas ions off a surface and treatment of etching a surface with the use of an etching gas.

With the use of an oxide semiconductor layer including a CAAC-OS for a field-effect transistor, a change in electrical characteristics of the field-effect transistor due to irradiation with visible light or ultraviolet light can be reduced; thus, the field-effect transistor can have high reliability.

The regions 404a and 404b illustrated in FIG. 8B are doped with a dopant and function as a source and a drain of the field-effect transistor. As the dopant, at least one of elements of Group 13 in the periodic table (e.g., boron), elements of Group 15 in the periodic table (e.g., one or more of nitrogen, phosphorus, and arsenic), and rare gas elements (e.g., one or more of helium, argon, and xenon) can be used, for example. A region functioning as a source of the field-effect transistor can be called source region, and a region functioning as a drain of the field-effect transistor can be called drain region. Addition of the dopant to the regions 404a and 404b can reduce the resistance between the regions 404a and 404b and the conductive layers.

The conductive layers 405a A, 405b_ A, 405a B, and 405b_B each function as the source or the drain of the field-effect transistor. Note that a layer functioning as a source of the field-effect transistor can be called source electrode or source wiring, and a layer functioning as a drain of the field-effect transistor can be called drain electrode or drain wiring.

The conductive layers 405a A, 405b A, 405a B, and 405b_B can be formed using, for example, a layer (single layer or stack of layers) including a metal material such as aluminum, magnesium, chromium, copper, tantalum, titanium, molybdenum, or tungsten or an alloy material containing any of the above metal materials as a main component.

Alternatively, the conductive layers 405a A, 405b A, 405a B, and 405b_B can be formed using a layer including a conductive metal oxide. Examples of the conductive metal oxide include indium oxide, tin oxide, zinc oxide, indium oxide-tin oxide, and indium oxide-zinc oxide. Note that silicon oxide may be contained in the conductive metal oxide that can be used for the conductive layers 405a A, 405b_A, 405a B, and 405b_B.

As the insulating layer 406, for example, a layer (single layer or stack of layers) including a material that can be used for the insulating layer 402_A can be used.

As the insulating layer 407, for example, a layer (single layer or stack of layers) including a material that can be used for the insulating layer 402_A can be used.

In the case where an oxide semiconductor layer is used as the semiconductor layer 403_A or the semiconductor layer 403_B, for example, dehydration or dehydrogenation is performed; thus, impurities such as hydrogen, water, a hydroxyl group, and a hydride (also referred to as hydrogen compound) are removed from the oxide semiconductor layer, and in addition, oxygen is supplied to the oxide semiconductor layer. In such a manner, the oxide semiconductor layer can be highly purified. For example, a layer containing oxygen is used as the layer in contact with the oxide semiconductor layer, and heat treatment is performed; thus, the oxide semiconductor layer can be highly purified.

For example, heat treatment is performed at a temperature higher than or equal to 400° C. and lower than or equal to 750° C., or higher than or equal to 400° C. and lower than the strain point of the substrate. Heat treatment may be further performed in a later step. As a heat treatment apparatus for the heat treatment, for example, an electric furnace or an apparatus for heating an object by heat conduction or heat radiation from a heater such as a resistance heater can be used; for example, a rapid thermal anneal (RTA) apparatus such as a gas rapid thermal anneal (GRTA) apparatus or a lamp rapid thermal anneal (LRTA) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for heat treatment using a high-temperature gas. As the high-temperature gas, a rare gas or an inert gas (e.g., nitrogen) which does not react with the object by the heat treatment can be used.

Further, after the heat treatment is performed and while the heating temperature is being maintained or being decreased, a high-purity oxygen gas, a high-purity $N_2O$ gas, or ultra-dry air (having a dew point −40° C. or lower, preferably −60° C. or lower) may be introduced into the furnace where the heat treatment has been performed. It is preferable that the oxygen gas or the $N_2O$ gas do not contain water, hydrogen, and the like. The purity of the oxygen gas or the $N_2O$ gas which is introduced into the heat treatment apparatus is preferably 6N or higher, further preferably 7N or higher; that is, the impurity concentration in the oxygen gas or the $N_2O$ gas is preferably 1 ppm or lower, further preferably 0.1 ppm or lower. By the action of the oxygen gas or the $N_2O$ gas, oxygen is supplied to the oxide semiconductor layer, and defects due to oxygen vacancy in the oxide semiconductor layer can be reduced. Note that the high-purity oxygen gas, high-purity $N_2O$ gas, or ultra-dry air may be introduced during the heat treatment.

When an oxide semiconductor layer including a CAAC-OS is formed, the oxide semiconductor film is formed by sputtering while the temperature of the element formation layer where the oxide semiconductor film is formed ranges from 100° C. to 600° C., preferably from 150° C. to 550° C., more preferably from 200° C. to 500° C. The oxide semiconductor film is deposited while the temperature of the element formation layer is high, whereby the atomic arrangement in the oxide semiconductor film is ordered, the density thereof is increased, so that a polycrystal or a CAAC-OS is easily formed. Furthermore, since an oxygen gas atmosphere is employed for the deposition, an unnecessary atom such as a rare gas atom is not contained in the film, so that a polycrystal or a CAAC-OS is easily formed. Note that a mixed gas atmosphere including an oxygen gas and a rare gas may be used. In that case, the percentage of an oxygen gas is higher than or equal to 30 vol. %, preferably higher than or equal to 50 vol. %, more preferably higher than or equal to 80 vol. %.

With the use of the highly purified oxide semiconductor layer for the field-effect transistor, the carrier density of the oxide semiconductor layer can be lower than $1\times10^{14}/cm^3$, preferably lower than $1\times10^{12}/cm^3$, further preferably lower than $1\times10^{11}/cm^3$. The off-state current of the field-effect transistor per micrometer of channel width can be 10 aA ($1\times10^{-17}$ A) or less, 1 aA ($1\times10^{-18}$ A) or less, 10 zA ($1\times10^{-20}$ A) or less, further 1 zA ($1\times10^{-21}$ A) or less, and furthermore 100 yA ($1\times10^{-22}$ A) or less. It is preferable that the off-state current of the field-effect transistor be as low as possible; the lower limit of the off-state current of the field-effect transistor in this embodiment is estimated to be about $10^{-30}$ A/p.m.

As described with reference to FIGS. 8A and 8B, a semiconductor device or a light-emitting device can be manufactured in such a manner that an example of the field-effect transistor in this embodiment is used as a field-effect transistor in the semiconductor device or the light-emitting device in the above embodiment.

Embodiment 5

In this embodiment, a structure example of a light-emitting device will be described. Note that here, for example, a light-emitting device has the circuit configuration in FIG. 2A.

A light-emitting device in this embodiment includes a first substrate where a semiconductor element such as a field-effect transistor is provided (the substrate is also referred to as an active matrix substrate), a second substrate, and a light-emitting element provided between the first substrate and the second substrate.

Figure 9A:
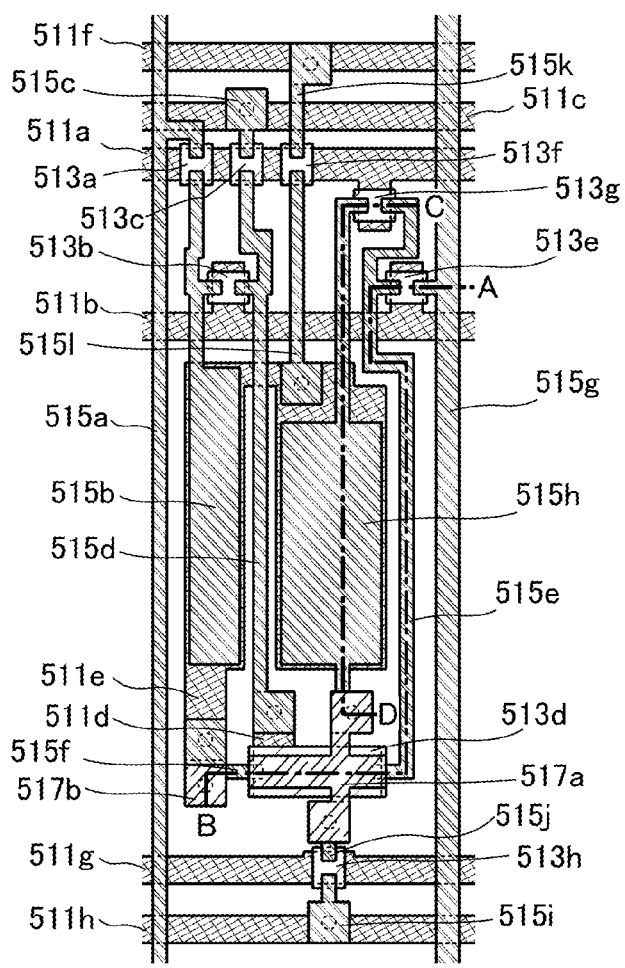
FIGS. 9A to 9C illustrate a structure example of an active matrix substrate.
Figure 9B:
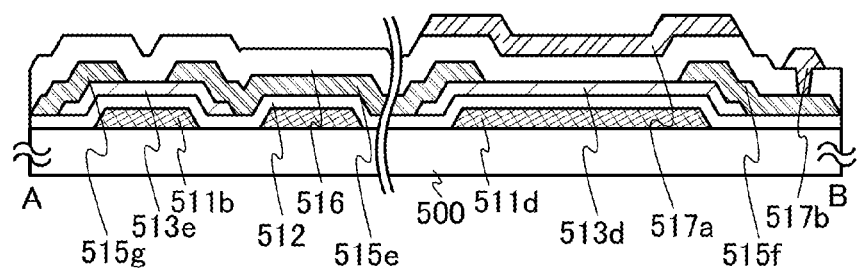
Figure 9C:
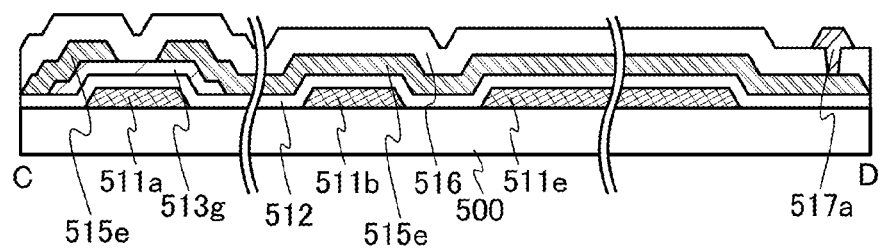

A structure example of the active matrix substrate in the light-emitting device in this embodiment will be described with reference to FIGS. 9A to 9C. FIGS. 9A to 9C illustrate a structure example of an active matrix substrate in the light-emitting device in this embodiment. FIG. 9A is a schematic plan view. FIG. 9B is a schematic cross-sectional view taken along line A-B in FIG. 9A. FIG. 9C is a schematic cross-sectional view taken along line C-D in FIG. 9A. Note that the components illustrated in FIGS. 9A to 9C include those having sizes different from the actual sizes. For convenience, in FIG. 9B, part of cross section taken along line A-B in FIG. 9A is not shown. Further, in FIG. 9C, part of cross section taken along line C-D in FIG. 9A is not shown.

The active matrix substrate in FIGS. 9A to 9C includes a substrate 500, conductive layers 511a to 511h, an insulating layer 512, semiconductor layers 513a to 513h, conductive layers 515a to 515l, an insulating layer 516, and conductive layers 517a and 517b.

The conductive layers 511a to 511h are provided on one plane of the substrate 500.

The conductive layer 511a functions as, for example, the gate of the field-effect transistor 111, the gate of the field-effect transistor 114, the gate of the field-effect transistor 116, the gate of the field-effect transistor 117, and the wiring 153 in the light-emitting device in FIG. 2A.

The conductive layer 511b functions as, for example, the gate of the field-effect transistor 112, the gate of the field-effect transistor 115, and the wiring 154 in the light-emitting device in FIG. 2A.

The conductive layer 511c functions as, for example, the wiring 156 in the light-emitting device in FIG. 2A.

The conductive layer 511d functions as, for example, the first gate of the field-effect transistor 113 in the light-emitting device in FIG. 2A.

The conductive layer 511e functions as, for example, the other of the pair of electrodes of the capacitor 121 and the other of the pair of electrodes of the capacitor 122 in the light-emitting device in FIG. 2A.

The conductive layer 511f functions as, for example, the wiring 157 in the light-emitting device in FIG. 2A.

The conductive layer 511g functions as, for example, the gate of the field-effect transistor 118 and the wiring 155 in the light-emitting device in FIG. 2A.

The conductive layer 511h functions as, for example, the wiring 158 in the light-emitting device in FIG. 2A.

The insulating layer 512 is provided over the conductive layers 511a to 511h. The insulating layer 512 functions as, for example, gate insulating layers of the field-effect transistors 111 to 118 and dielectric layers of the capacitors 121 and 122 in the light-emitting device in FIG. 2A.

The semiconductor layer 513a overlaps with the conductive layer 511a with the insulating layer 512 therebetween. The semiconductor layer 513a functions as, for example, a channel formation layer of the field-effect transistor 111 in the light-emitting device in FIG. 2A.

The semiconductor layer 513b overlaps with the conductive layer 511b with the insulating layer 512 therebetween. The semiconductor layer 513b functions as, for example, a channel formation layer of the field-effect transistor 112 in the light-emitting device in FIG. 2A.

The semiconductor layer 513c overlaps with the conductive layer 511a with the insulating layer 512 therebetween. The semiconductor layer 513c functions as, for example, a channel formation layer of the field-effect transistor 116 in the light-emitting device in FIG. 2A.

The semiconductor layer 513d overlaps with the conductive layer 511d with the insulating layer 512 therebetween. The semiconductor layer 513d functions as, for example, a channel formation layer of the field-effect transistor 113 in the light-emitting device in FIG. 2A.

The semiconductor layer 513e overlaps with the conductive layer 511b with the insulating layer 512 therebetween. The semiconductor layer 513e functions as, for example, a channel formation layer of the field-effect transistor 115 in the light-emitting device in FIG. 2A.

The semiconductor layer 513f overlaps with the conductive layer 511a with the insulating layer 512 therebetween. The semiconductor layer 513f functions as, for example, a channel formation layer of the field-effect transistor 117 in the light-emitting device in FIG. 2A.

The semiconductor layer 513g overlaps with the conductive layer 511a with the insulating layer 512 therebetween. The semiconductor layer 513g functions as, for example, a channel formation layer of the field-effect transistor 114 in the light-emitting device in FIG. 2A.

The semiconductor layer 513h overlaps with the conductive layer 511g with the insulating layer 512 therebetween.

The semiconductor layer 513h functions as, for example, a channel formation layer of the field-effect transistor 118 in the light-emitting device in FIG. 2A.

The conductive layer 515a is electrically connected to the semiconductor layer 513a. The conductive layer 515a functions as, for example, the one of the source and the drain of the field-effect transistor 111 and the wiring 151 in the light-emitting device in FIG. 2A.

The conductive layer 515b is electrically connected to the semiconductor layers 513a and 513b. Further, the conductive layer 515b overlaps with the conductive layer 511e with the insulating layer 512 therebetween. The conductive layer 515b functions as, for example, the other of the source and the drain of the field-effect transistor 111, the one of the source and the drain of the field-effect transistor 112, and the one of the pair of electrodes of the capacitor 121 in the light-emitting device in FIG. 2A.

The conductive layer 515c is electrically connected to the semiconductor layer 513c. In addition, the conductive layer 515c is electrically connected to the conductive layer 511c through an opening penetrating the insulating layer 512. The conductive layer 515c functions as, for example, the one of the source and the drain of the field-effect transistor 116 in the light-emitting device in FIG. 2A.

The conductive layer 515d is electrically connected to the semiconductor layer 513b. The conductive layer 515d overlaps with the semiconductor layer 513c. In addition, the conductive layer 515d is electrically connected to the conductive layer 511d through an opening penetrating the insulating layer 512. The conductive layer 515d functions as, for example, the other of the source and the drain of the field-effect transistor 112 and the other of the source and the drain of the field-effect transistor 116 in the light-emitting device in FIG. 2A.

The conductive layer 515e is electrically connected to the semiconductor layer 513d, the semiconductor layer 513e, and the semiconductor layer 513g. The conductive layer 515e functions as, for example, the one of the source and the drain of the field-effect transistor 113, the one of the source and the drain of the field-effect transistor 114, and the other of the source and the drain of the field-effect transistor 115 in the light-emitting device in FIG. 2A.

The conductive layer 515f is electrically connected to the semiconductor layer 513d. In addition, the conductive layer 515f is electrically connected to the conductive layer 511e through an opening penetrating the insulating layer 512. The conductive layer 515f functions as, for example, the other of the source and the drain of the field-effect transistor 113 in the light-emitting device in FIG. 2A.

The conductive layer 515g is electrically connected to the semiconductor layer 513e. The conductive layer 515g functions as, for example, the one of the source and the drain of the field-effect transistor 115 and the wiring 152 in the light-emitting device in FIG. 2A.

The conductive layer 515h is electrically connected to the semiconductor layer 513g. The conductive layer 515h overlaps with the conductive layer 511e with the insulating layer 512 therebetween. The conductive layer 515h functions as, for example, the other of the source and the drain of the field-effect transistor 114 and the one of the pair of electrodes of the capacitor 122 in the light-emitting device in FIG. 2A.

The conductive layer 515i is electrically connected to the semiconductor layer 513h. In addition, the conductive layer 515i is electrically connected to the conductive layer 511h through an opening penetrating the insulating layer 512. The conductive layer 515i functions as, for example, the one of the source and the drain of the field-effect transistor 118 in the light-emitting device in FIG. 2A.

The conductive layer 515j is electrically connected to the semiconductor layer 513h. The conductive layer 515j functions as, for example, the other of the source and the drain of the field-effect transistor 118 in the light-emitting device in FIG. 2A.

The conductive layer 515k is electrically connected to the semiconductor layer 513f. In addition, the conductive layer 515k is electrically connected to the conductive layer 511f through an opening penetrating the insulating layer 512. The conductive layer 515k functions as, for example, the one of the source and the drain of the field-effect transistor 117 in the light-emitting device in FIG. 2A.

The conductive layer 515l is electrically connected to the semiconductor layer 513f. In addition, the conductive layer 515l is electrically connected to the conductive layer 511e through an opening penetrating the insulating layer 512. The conductive layer 515l functions as, for example, the other of the source and the drain of the field-effect transistor 117 in the light-emitting device in FIG. 2A.

The insulating layer 516 is provided over the semiconductor layers 513a to 513h and the conductive layers 515a to 515l.

The conductive layer 517a overlaps with the semiconductor layer 513d with the insulating layer 516 therebetween. In addition, the conductive layer 517a is electrically connected to the conductive layers 515h and 515j through openings penetrating the insulating layer 516. The conductive layer 517a functions as, for example, the second gate of the field-effect transistor 113 in the light-emitting device in FIG. 2A.

The conductive layer 517b is electrically connected to the conductive layer 515f through an opening penetrating the insulating layer 516.

Figure 10:
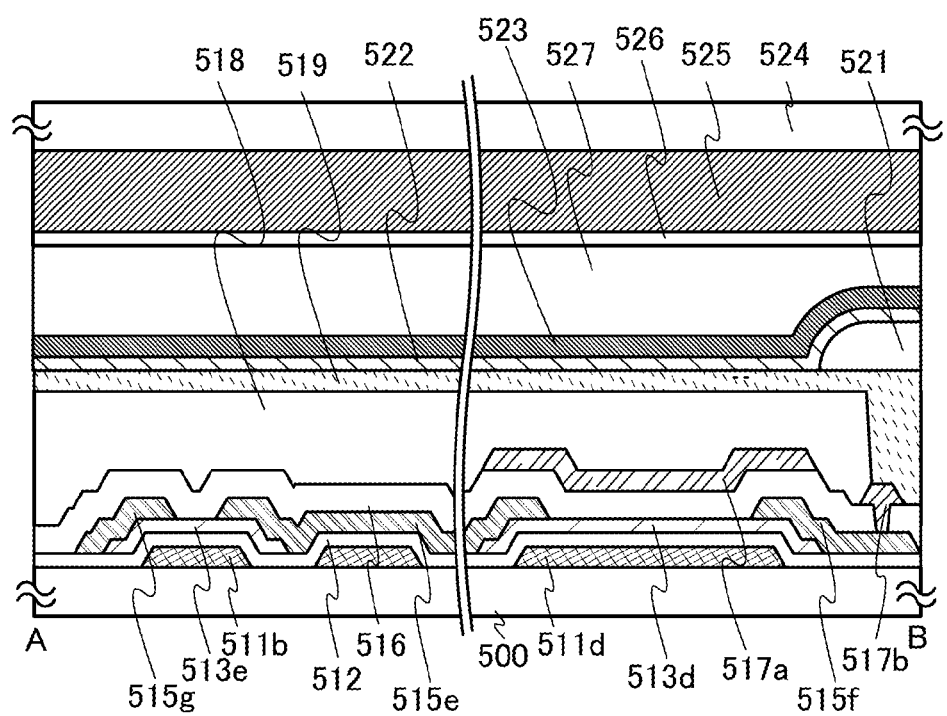
FIG. 10 illustrates a structure example of a light-emitting device.

Next, a structure example of the light-emitting device in this embodiment will be described with reference to FIG. 10. FIG. 10 is a schematic cross-sectional view illustrating a structure example of the light-emitting device in this embodiment. Note that in this embodiment, a light-emitting element in the light-emitting device emits light toward the top surface side of the light-emitting device; however, structures of light-emitting devices according to one embodiment of the present invention are not limited thereto. The light-emitting device may emit light toward the bottom surface side.

The light-emitting device illustrated in FIG. 10 includes an insulating layer 518, a conductive layer 519, an insulating layer 521, a light-emitting layer 522, a conductive layer 523, a substrate 524, a coloring layer 525, an insulating layer 526, and an insulating layer 527 in addition to the active matrix substrate illustrated in FIGS. 9A to 9C.

The insulating layer 518 is provided over the insulating layer 516, the conductive layer 517a, and the conductive layer 517b.

The conductive layer 519 is provided over the insulating layer 518. The conductive layer 519 is electrically connected to the conductive layer 517b through an opening penetrating the insulating layer 518. The conductive layer 519 functions as, for example, the one of the anode and the cathode of the light-emitting element 140 in FIG. 2A.

The insulating layer 521 is provided over the conductive layer 519.

The light-emitting layer 522 is electrically connected to the conductive layer 519 through an opening provided in the insulating layer 521. The light-emitting layer 522 functions as, for example, a light-emitting layer of the light-emitting element 140 in FIG. 2A.

The conductive layer 523 is electrically connected to the light-emitting layer 522. The conductive layer 523 functions as, for example, the other of the anode and the cathode of the light-emitting element 140 in FIG. 2A.

Note that in an example of the light-emitting device in this embodiment, the light-emitting element has a structure in which light is emitted upwardly; however, one embodiment of the present invention is not limited thereto, and the light-emitting element may have a structure in which light is emitted downwardly.

The coloring layer 525 is provided on one plane of the substrate 524 so as to transmit light with a specific wavelength which is emitted from the light-emitting layer 522.

The insulating layer 526 is provided on one plane side of the substrate 524 with the coloring layer 525 therebetween.

The insulating layer 527 is provided between the insulating layer 526 and the conductive layer 523.

The components of the light-emitting device described with reference to FIGS. 9A to 9C and FIG. 10 are described.

A glass substrate or a plastic substrate, for example, can be used for the substrates 500 and 524. Note that the substrates 500 and 524 are not necessarily provided.

The conductive layers 511a to 511h can be formed using a layer (single layer or stack of layers) including a material applicable to the conductive layer 401_A in FIG. 8A, for example.

The insulating layer 512 can be formed using a layer (single layer or stack of layers) including a material applicable to the insulating layer 402_A in FIG. 8A, for example.

The semiconductor layers 513a to 513h can be formed using a layer including a material applicable to the semiconductor layer 403_A in FIG. 8A, for example.

The conductive layers 515a to 515l can be formed using a layer (single layer or stack of layers) including a material applicable to the conductive layers 405a_A and 405b_A in FIG. 8A, for example.

The insulating layer 516 can be formed using a layer (single layer or stack of layers) including a material applicable to the insulating layer 406 in FIG. 8A, for example.

The conductive layers 517a and 517b can be formed using a layer (single layer or stack of layers) including a material applicable to the conductive layers 511a to 511h, for example.

The insulating layer 518 can be formed using a layer (single layer or stack of layers) including a material applicable to the insulating layer 512, for example.

The conductive layer 519 can be formed using a layer (single layer or stack of layers) including a material applicable to the conductive layers 511a to 511h, for example.

As the insulating layer 521, an organic insulating layer or an inorganic insulating layer can be used, for example.

The light-emitting layer 522 is a layer which emits light of a specific color. As the light-emitting layer 522, for example, a light-emitting layer using a light-emitting material which emits light of a specific color can be used. The light-emitting layer 522 can also be formed using a stack of light-emitting layers which emit light of different colors. As the light-emitting material, an electroluminescent material such as a fluorescent material or a phosphorescent material can be used. Alternatively, as the light-emitting material, a material containing a plurality of electroluminescent materials may be used. The light-emitting layer 522 emitting white light may be formed with a stack of a layer of a fluorescent material emitting blue light, a layer of a first phosphorescent material emitting orange light, and a layer of a second phosphorescent material emitting orange light, for example. Alternatively, as the electroluminescent material, an organic electroluminescent material or an inorganic electroluminescent material can be used. Alternatively, the light-emitting layer may be formed using, for example, in addition to the above-described light-emitting layer, one or more of the following layers: a hole-injection layer, a hole-transport layer, an electron-transport layer, and an electron-injection layer.

The conductive layer 523 can be formed using a layer (single layer or stack of layers) including a light-transmitting material selected from the materials that can be used for the conductive layers 511a to 511h, for example.

The coloring layer 525 can be formed using a layer which contains dye or pigment, for example, and which transmits light with the wavelength range of red, light with the wavelength range of green, or light with the wavelength range of blue. Alternatively, the coloring layer 525 can be formed using a layer which transmits cyan light, magenta light, or yellow light and which contains dye or pigment. For example, the coloring layer 525 is formed by a photolithography method, a printing method, an inkjet method, an electrodeposition method, an electrophotographic method, or the like. By using an inkjet method, for example, the coloring layer can be manufactured at room temperature, manufactured at a low vacuum, or formed over a large substrate. Since the coloring layer can be manufactured without a resist mask, manufacturing cost and the number of steps can be reduced.

The insulating layer 526 can be formed using a layer (single layer or stack of layers) including a material applicable to the insulating layer 512, for example. Note that the insulating layer 526 is not necessarily provided; however, by providing the insulating layer 526, entry of an impurity from the coloring layer 525 to the light-emitting element can be prevented.

As the insulating layer 527, a layer (single layer or stack of layers) including a material applicable to the insulating layer 512 or a layer including a resin material can be used, for example.

As described with reference to FIGS. 9A to 9C and FIG. 10, an example of the light-emitting device in this embodiment includes a light-emitting element emitting light of a specific color, and a coloring layer transmitting light with a specific wavelength which is emitted from the light-emitting element. This structure enables a full-color image to be displayed without forming a plurality of light-emitting elements emitting light of different colors, thereby facilitating the manufacturing process and enhancing yield. For example, a light-emitting element can be formed without a metal mask, and therefore, a manufacturing process can be simple. Further, contrast of an image can be improved.

Embodiment 6

In this embodiment, examples of an electronic device will be described.

Structure examples of the electronic devices according to this embodiment will be described with reference to FIGS. 11A to 11C and FIGS. 12A and 12B. FIGS. 11A to 11C and FIGS. 12A and 12B are schematic views of structure examples of the electronic devices according to this embodiment.

Figure 11A:
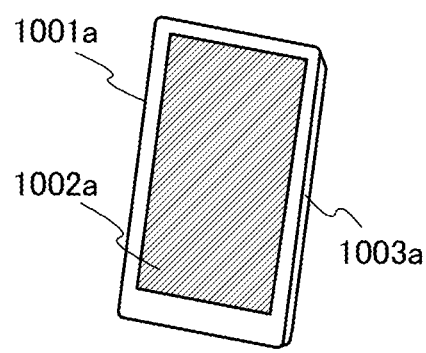
FIGS. 11A to 11C each illustrate an electronic device.

An electronic device in FIG. 11A is an example of a portable information terminal. The portable information terminal in FIG. 11A includes a housing 1001a and a display portion 1002a provided in the housing 1001a.

Note that a side surface 1003a of the housing 1001a may be provided with a connection terminal for connecting the portable information terminal in FIG. 11A to an external device and/or a button used to operate the portable information terminal.

In the housing 1001a of the portable information terminal illustrated in FIG. 11A, a CPU, a main memory, an interface with which signals are transmitted and received between the external device and each of the CPU and the main memory, and an antenna which transmits and receives signals to/from the external device are provided. Note that in the housing 1001a, one or plural integrated circuits having a specific function may be provided.

The portable information terminal illustrated in FIG. 11A has a function of one or more of a telephone set, an e-book reader, a personal computer, and a game machine.

Figure 11B:
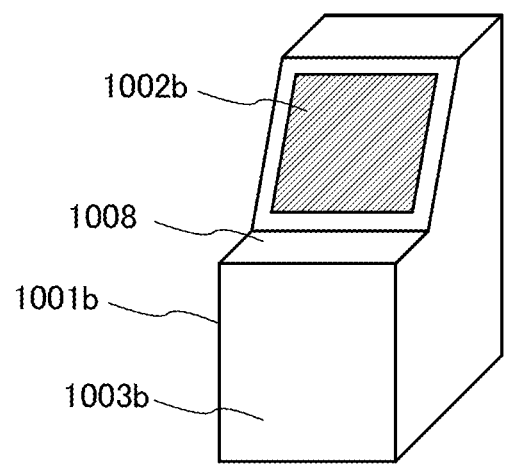

An electronic device in FIG. 11B is an example of a stationary information terminal. The stationary information terminal illustrated in FIG. 11B includes a housing 1001b and a display portion 1002b provided in the housing 1001b.

Note that the display portion 1002b may be provided on a deck portion 1008 of the housing 1001b.

The stationary information terminal illustrated in FIG. 11B includes a CPU, a main memory, and an interface for transmitting and receiving signals between the external device and each of the CPU and the main memory, in the housing 1001b. Note that in the housing 1001c, one or plural integrated circuits having a specific function may be provided. Note that the stationary information terminal in FIG. 11B may be further provided with an antenna which transmits and receives signals to/from the external device.

Further, a side surface 1003b of the housing 1001b in the stationary information terminal in FIG. 11B may be provided with one or more parts selected from a ticket ejection portion that ejects a ticket or the like, a coin slot, and a bill slot.

The stationary information terminal in FIG. 11B serves, for example, as an automated teller machine, an information communication terminal for ticketing or the like (also referred to as a multi-media station), or a game machine.

Figure 11C:
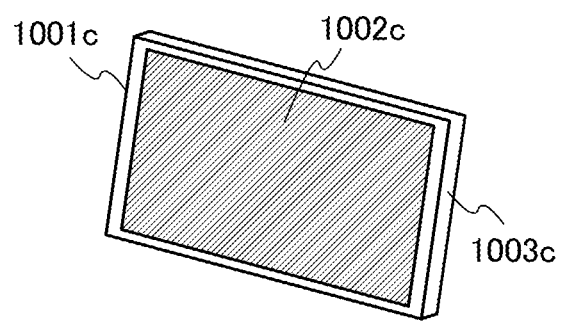

FIG. 11C illustrates an example of a stationary information terminal. The stationary information terminal illustrated in FIG. 11C includes a housing 1001c and a display portion 1002c provided in the housing 1001c. Note that a support for supporting the housing 1001c may also be provided.

Note that a side surface 1003c of the housing 1001c may be provided with a connection terminal for connecting the stationary information terminal in FIG. 11C to an external device and/or a button used to operate the stationary information terminal.

The stationary information terminal illustrated in FIG. 11C may include a CPU, a main memory, and an interface for transmitting and receiving signals between the external device and each of the CPU and the main memory, in the housing 1001c. Note that in the housing 1001c, one or plural integrated circuits having a specific function may be provided. Note that the stationary information terminal in FIG. 11C may be further provided with an antenna which transmits and receives signals to/from the external device.

The stationary information terminal in FIG. 11C serves, for example, as a digital photo frame, an output monitor, or a television set.

The structure of the light-emitting device in the above embodiment can be used for, for example, a display portion of an electronic device; for example, the light-emitting device in Embodiment 2 can be used as the display portions 1002a to 1002c in FIGS. 11A to 11C.

Figure 12A:
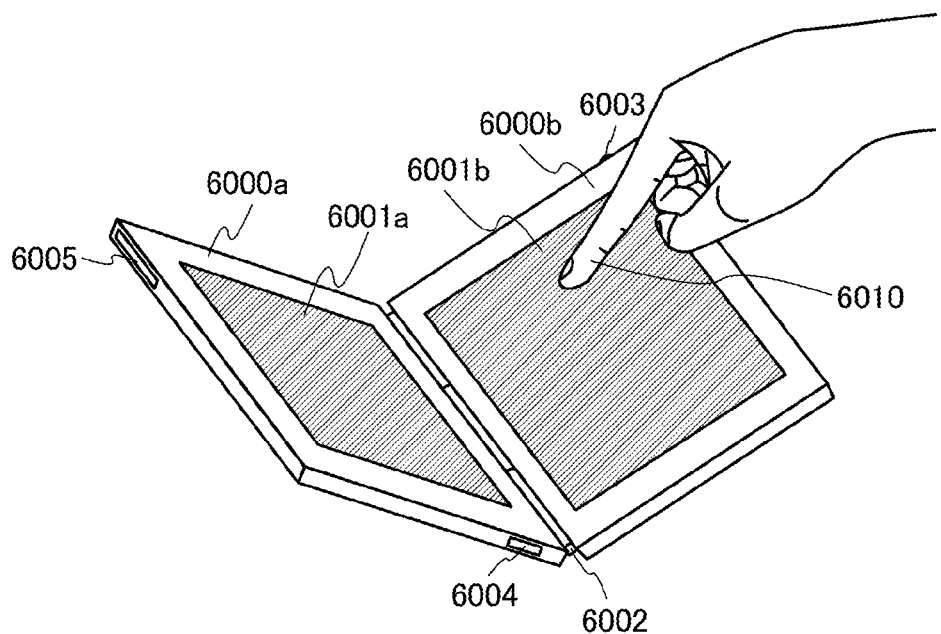
FIGS. 12A and 12B illustrate an example of an electronic device.
Figure 12B:
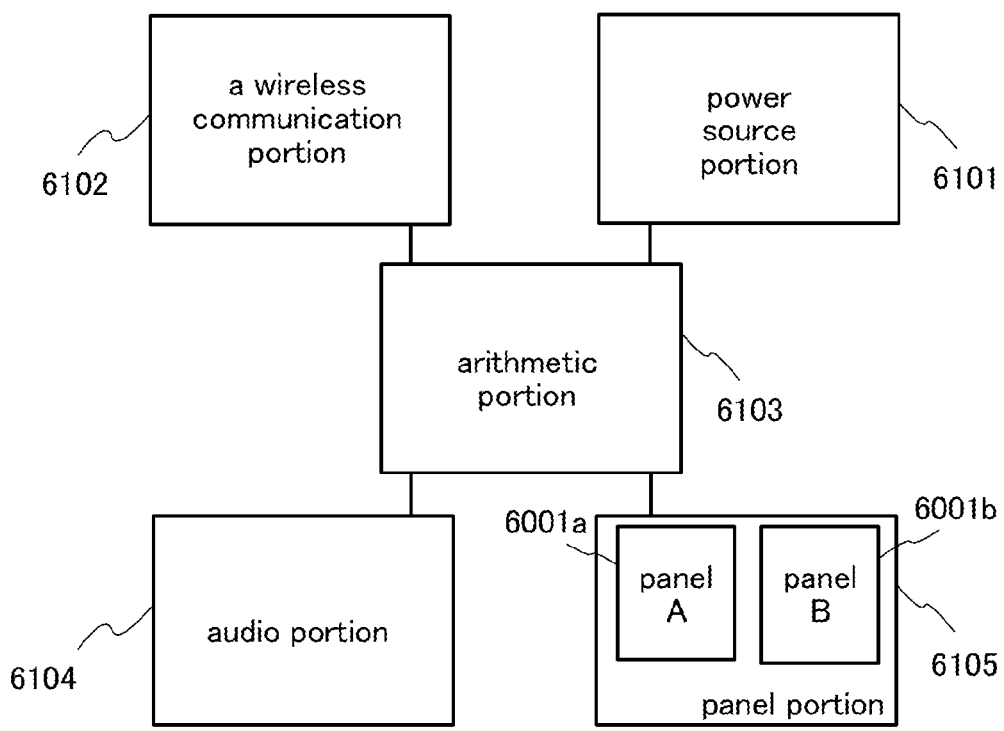

Further, an electronic device illustrated in FIGS. 12A and 12B is an example of a folding information terminal. FIG. 12A is a schematic external view, and FIG. 12B is a block diagram.

The electronic device in FIGS. 12A and 12B includes a housing 6000a, a housing 6000b, a panel 6001a, a panel 6001b, a hinge 6002, a button 6003, a connection terminal 6004, and a storage medium insertion portion 6005, as illustrated in FIG. 12A. In addition, the electronic device in FIGS. 12A and 12B has a power source portion 6101, a wireless communication portion 6102, an arithmetic portion 6103, an audio portion 6104, and a panel portion 6105, as illustrated in FIG. 12B.

The panel 6001a is provided in the housing 6000a.

The panel 6001b is provided in the housing 6000b. The housing 6000b is connected to the housing 6000a with the hinge 6002.

The panel 6001a and the panel 6001b function as display panels. For example, the panel 6001a and the panel 6001b may display different images or one image.

As the panel 6001a and the panel 6001b, the light-emitting device in Embodiment 2 can be used.

Further, one of or both the panel 6001a and the panel 6001b may function as a touch panel. In this case, data may be input in such a manner that an image of a keyboard is displayed on one of or both the panel 6001a and the panel 6001b and then touched with a finger 6010 or the like. Alternatively, the display panel and the touch panel may be stacked, so that one of or both the panel 6001a and the panel 6001b are formed. Further alternatively, one of or both the panel 6001a and the panel 6001b may be formed with the use of an input-output panel provided with a display circuit and a light detection circuit.

In the electronic device illustrated in FIGS. 12A and 12B, the housing 6000a can be made to overlap with the housing 6000b by moving the housing 6000a or the housing 6000b with the use of the hinge 6002, so that the electronic device can be folded.

The button 6003 is provided on the housing 6000b. Alternatively, the button 6003 may be provided on the housing 6000a. Further alternatively, a plurality of buttons 6003 may be provided on one of or both the housing 6000a and the housing 6000b. For example, when the button 6003 which is a power button is provided and pushed, the state of the electronic device can be controlled, i.e., the electronic device can be set to an on state or an off state.

The connection terminal 6004 is provided on the housing 6000a. Alternatively, the connection terminal 6004 may be provided on the housing 6000b. Further alternatively, a plurality of connection terminals 6004 may be provided on one of or both the housing 6000a and the housing 6000b. For example, when the electronic device is connected to a personal computer via the connection terminal 6004, data stored in the electronic device may be rewritten using the personal computer.

The storage medium insertion portion 6005 is provided on the housing 6000a. Alternatively, the storage medium insertion portion 6005 may be provided on the housing 6000b. Further alternatively, a plurality of storage medium insertion portions 6005 may be provided on one of or both the housing 6000a and the housing 6000b. For example, when a card storage medium is inserted into the storage medium insertion portion, data can be read from the card storage medium and written to the electronic device, or data can be read from the electronic device and written to the card storage medium.

The power source portion 6101 has a function of supplying power for driving the electronic device. For example, from the power source portion 6101, power is supplied to the wireless communication portion 6102, the arithmetic portion 6103, the audio portion 6104, and the panel portion 6105. The power source portion 6101 is provided with a power storage device, for example. The power storage device is provided in one of or both the housing 6000a and the housing 6000b. Note that a power supply circuit which generates a power supply voltage for driving the electronic device may be provided in the power source portion 6101. In this case, in the power supply circuit, the power supply voltage is generated using power supplied from the power storage device. Further, the power source portion 6101 may be connected to a commercial power supply.

The wireless communication portion 6102 has a function of transmitting and receiving electric waves. For example, the wireless communication portion 6102 is provided with an antenna, a demodulation circuit, a modulation circuit, and the like. In this case, for example, electric waves are transmitted and received at the antenna, whereby data is exchanged with an external device. Note that a plurality of antennas may be provided in the wireless communication portion 6102.

The arithmetic portion 6103 has a function of conducting arithmetic processing in response to instruction signals input from the wireless communication portion 6102, the audio portion 6104, and the panel portion 6105, for example. For example, the arithmetic portion 6103 is provided with a CPU, a logic circuit, a memory circuit, and the like.

The audio portion 6104 has a function of controlling input/output of sound that is audio data. For example, the audio portion 6104 is provided with a speaker and a microphone.

The power source portion 6101, the wireless communication portion 6102, the arithmetic portion 6103, and the audio portion 6104 are provided, for example, inside one of or both the housing 6000a and the housing 6000b.

The panel portion 6105 has a function of controlling operation of the panel 6001a (also referred to as panel A) and the panel 6001b (also referred to as panel B). Note that a driver circuit for controlling the driving of the panel 6001a and the panel 6001b may be provided in the panel portion 6105 so that operation of the panel 6001a and the panel 6001b can be controlled.

Note that a control circuit may be provided in one or a plurality of the power source portion 6101, the wireless communication portion 6102, the arithmetic portion 6103, the audio portion 6104, and the panel portion 6105, thereby controlling operation. Further, a control circuit may be provided in the arithmetic portion 6103, thereby controlling operation of one or a plurality of the power source portion 6101, the wireless communication portion 6102, the audio portion 6104, and the panel portion 6105.

Further, a memory circuit may be provided in one or a plurality of the power source portion 6101, the wireless communication portion 6102, the audio portion 6104, and the panel portion 6105, whereby data necessary for operation may be stored in the memory circuit. Thus, operation speed can be improved.

The electronic device illustrated in FIGS. 12A and 12B can receive electric power from the commercial power supply and use electric power stored in the power storage device. Thus, even when electric power cannot be supplied from the commercial power supply because of power outage or the like, the electronic device can be operated with the use of the power storage device as a power supply.

When the structure shown in FIGS. 12A and 12B is employed, the electronic device in FIGS. 12A and 12B can have one or a plurality of functions of a telephone set, an e-book reader, a personal computer, and a game machine, for example.

The above is the description of an example of an electronic device in this embodiment.

As described with reference to FIGS. 11A to 11C and FIGS. 12A and 12B, the example of the electronic device in this embodiment has a structure in which the panel portion including the light-emitting device described in the above embodiment is provided.

In addition, in the examples of electronic devices in this embodiment, the housings may be each provided with one or more of a photoelectric conversion portion which generates power supply voltage according to incident illuminance of light and an operation portion for operating the electronic device. For example, when the photoelectric conversion portion is provided, an external power supply is not needed; thus, the electronic device can be used for a long time even in an environment where an external power supply is not provided.

This application is based on Japanese Patent Application serial no. 2011-202690 filed with Japan Patent Office on Sep. 16, 2011, the entire contents of which are hereby incorporated by reference.

What is claimed is:

1. A light-emitting device comprising:
   a first transistor;
   a second transistor;
   a third transistor;
   a first capacitor;
   a second capacitor; and
   a light-emitting element,
   wherein the first transistor comprises a first gate electrode, a second gate electrode, and a semiconductor layer that comprises a channel formation region,
   wherein the first transistor is capable of supplying current to the light-emitting element,
   wherein the semiconductor layer comprises a region interposed between the first gate electrode and the second gate electrode,
   wherein the first gate electrode is electrically connected to a data signal line through the second transistor,
   wherein the first gate electrode is electrically connected to the first capacitor,
   wherein the second gate electrode is electrically connected to a potential supply line through the third transistor, and
   wherein the second gate electrode is electrically connected to the second capacitor.

2. The light-emitting device according to claim 1, wherein the semiconductor layer is an oxide semiconductor layer.

3. The light-emitting device according to claim 2,
   wherein the oxide semiconductor layer comprises regions whose c-axes are perpendicular to a surface of the oxide semiconductor layer, and
   wherein a direction of a-axis of one of regions is different from a direction of a-axis of another of regions.

4. The light-emitting device according to claim 2, wherein the oxide semiconductor layer comprises an In—Ga—Zn-based oxide.

5. The light-emitting device according to claim 1, wherein a threshold voltage of the first transistor is capable of varying depending on a potential of the second gate electrode.

6. The light-emitting device according to claim 1, wherein the light-emitting element is an electroluminescent element.

7. The light-emitting device according to claim 1, further comprising:
   a fourth transistor; and
   a fifth transistor,
   wherein the light-emitting element is electrically connected to a potential supply line through the fourth transistor, and
   wherein the second gate electrode is electrically connected to a potential supply line through the fifth transistor.

8. A light-emitting device comprising:
   a first transistor;
   a second transistor;
   a third transistor;
   a first capacitor;
   a second capacitor; and
   a light-emitting element,
   wherein the first transistor comprises a first gate electrode, a second gate electrode, and a semiconductor layer that comprises a channel formation region,
   wherein the first transistor is capable of supplying current to the light-emitting element,
   wherein the semiconductor layer comprises a region interposed between the first gate electrode and the second gate electrode,
   wherein the first gate electrode is electrically connected to a data signal line through the second transistor,
   wherein the first gate electrode is electrically connected to the first capacitor,
   wherein the second gate electrode is electrically connected to a potential supply line through the third transistor,
   wherein the second gate electrode is electrically connected to the second capacitor,
   wherein the second gate electrode is directly connected to a first terminal of the second capacitor, and one of a source or drain of the first transistor is directly connected to a second terminal of the second capacitor.

9. The light-emitting device according to claim 8, wherein the semiconductor layer is an oxide semiconductor layer.

10. The light-emitting device according to claim 9,
    wherein the oxide semiconductor layer comprises regions whose c-axes are perpendicular to a surface of the oxide semiconductor layer, and
    wherein a direction of a-axis of one of regions is different from a direction of a-axis of another of regions.

11. The light-emitting device according to claim 9, wherein the oxide semiconductor layer comprises an In—Ga—Zn-based oxide.

12. The light-emitting device according to claim 8, wherein a threshold voltage of the first transistor is capable of varying depending on a potential of the second gate electrode.

13. The light-emitting device according to claim 8, wherein the light-emitting element is an electroluminescent element.

14. The light-emitting device according to claim 8, further comprising:
    a fourth transistor; and
    a fifth transistor,
    wherein the light-emitting element is electrically connected to a potential supply line through the fourth transistor, and
    wherein the second gate electrode is electrically connected to a potential supply line through the fifth transistor.

* * * * *